(12) United States Patent
Xie et al.

(10) Patent No.: US 12,183,740 B2
(45) Date of Patent: Dec. 31, 2024

(54) STACKED FIELD-EFFECT TRANSISTORS

(71) Applicant: International Business Machines Corporation, Armonk, NY (US)

(72) Inventors: Ruilong Xie, Niskayuna, NY (US); Kangguo Cheng, Schenectady, NY (US); Curtis S. Durfee, Schenectady, NY (US); Jay William Strane, Warwick, NY (US); Min Gyu Sung, Latham, NY (US); Julien Frougier, Albany, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 17/805,507

(22) Filed: Jun. 6, 2022

(65) Prior Publication Data

US 2023/0395600 A1 Dec. 7, 2023

(51) Int. Cl.
*H01L 27/092* (2006.01)
*H01L 21/762* (2006.01)
*H01L 21/8238* (2006.01)
*H01L 29/06* (2006.01)
*H01L 29/423* (2006.01)
*H01L 29/66* (2006.01)
*H01L 29/786* (2006.01)

(52) U.S. Cl.
CPC .... *H01L 27/0924* (2013.01); *H01L 21/76224* (2013.01); *H01L 21/823807* (2013.01); *H01L 21/823814* (2013.01); *H01L 29/0665* (2013.01); *H01L 29/42392* (2013.01); *H01L 29/66553* (2013.01); *H01L 29/66742* (2013.01); *H01L 29/78618* (2013.01); *H01L 29/78696* (2013.01)

(58) Field of Classification Search
CPC .......... H01L 27/0924; H01L 21/76224; H01L 21/823807; H01L 21/823814; H01L 29/0665; H01L 29/42392; H01L 29/66553; H01L 29/66742; H01L 29/78618; H01L 29/78696; H01L 21/8221; H01L 27/0688; H01L 27/092; H01L 29/0673; H01L 29/66439; H01L 29/66545; H01L 29/775; B82Y 10/00
See application file for complete search history.

(56) References Cited

U.S. PATENT DOCUMENTS 7,135,724 B2 11/2006 Chen et al.
9,391,163 B2 7/2016 Chang et al.
(Continued)

OTHER PUBLICATIONS

Ryckaert et al., "The Complementary FET (CFET) for CMOS scaling beyond N3," Symposium on VLSI Technology, 2018, pp. 141-142.

*Primary Examiner* — J. E. Schoenholtz
(74) *Attorney, Agent, or Firm* — Kimberly Zillig

(57) ABSTRACT

Provided is a stacked field-effect transistor (FET). The stacked FET comprises a top device, a bottom device, and a transition region between the top device and the bottom device. The transition region includes a plurality of inner spacers and a first inter-layer dielectric (ILD). The ILD is formed between each of the plurality of inner spacers. The top and bottom devices have a first channel sheet thickness in a gate region and a second channel sheet thickness between inner spacers. The second channel sheet thickness is larger than both the first channel sheet thickness and the first distance.

20 Claims, 18 Drawing Sheets

(56) References Cited

U.S. PATENT DOCUMENTS

| | | | |
|---|---|---|---|
| 9,831,324 B1 | 11/2017 | Chao et al. | |
| 10,192,819 B1 | 1/2019 | Chanemougame et al. | |
| 10,192,867 B1 | 1/2019 | Frougier et al. | |
| 10,256,158 B1 | 4/2019 | Frougier et al. | |
| 10,784,171 B2 | 9/2020 | Frougier et al. | |
| 11,201,153 B2 | 12/2021 | Xie et al. | |
| 12,107,131 B2 * | 10/2024 | Hsu | H01L 29/42392 |
| 2020/0286992 A1 * | 9/2020 | Song | H01L 29/0673 |
| 2021/0305410 A1 | 9/2021 | Yao et al. | |
| 2023/0197522 A1 * | 6/2023 | Chan | H01L 21/8221 |
| | | | 438/284 |
| 2023/0369512 A1 * | 11/2023 | Yeong | H01L 29/7848 |

* cited by examiner

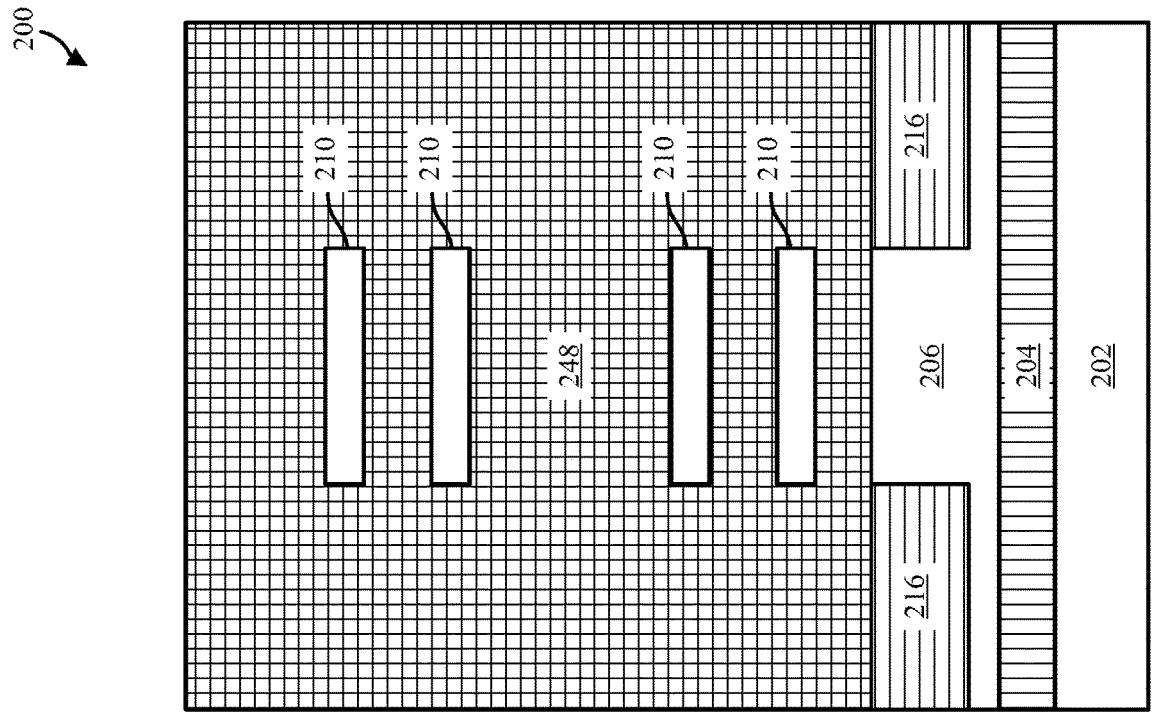
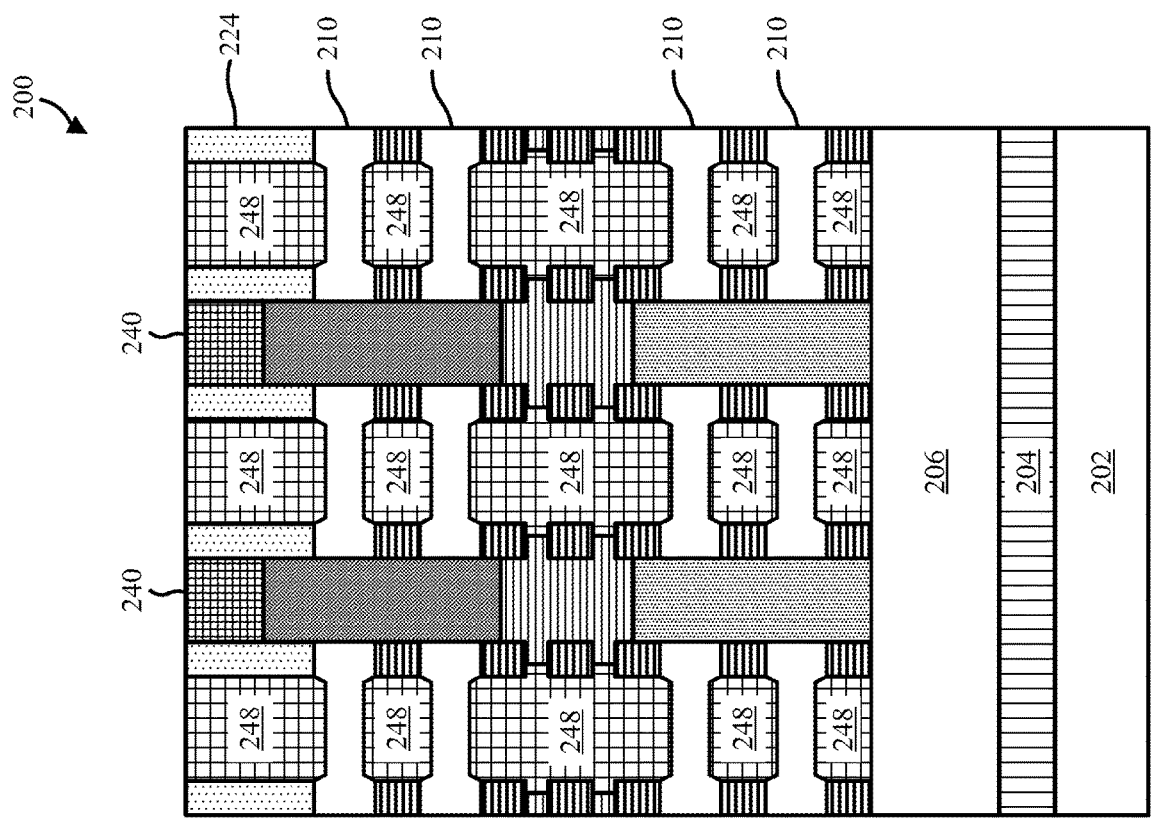
FIG. 12B
FIG. 12A

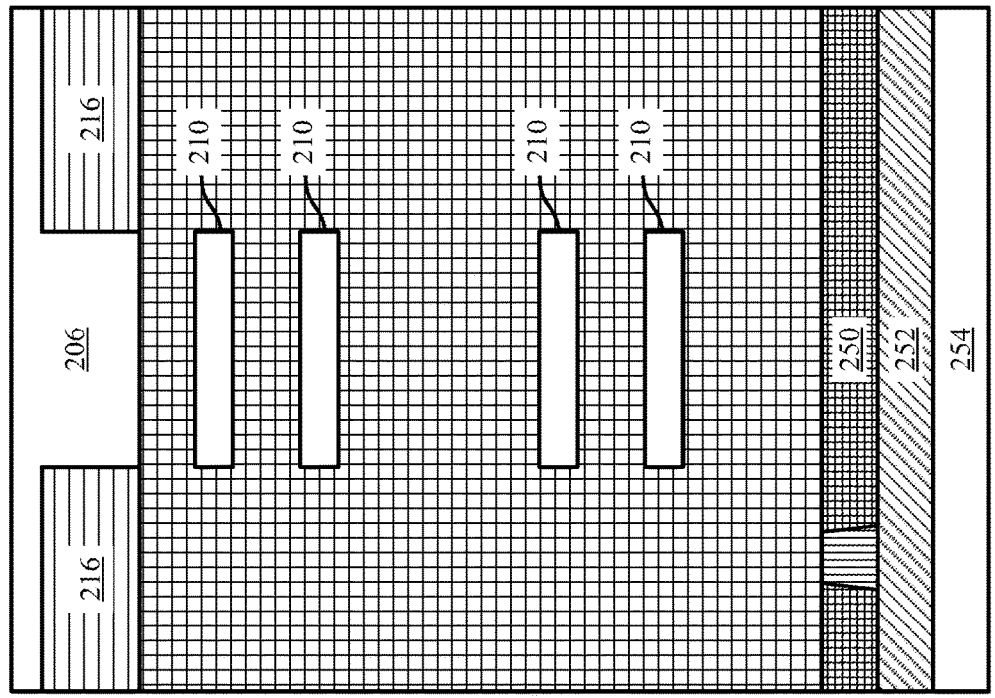
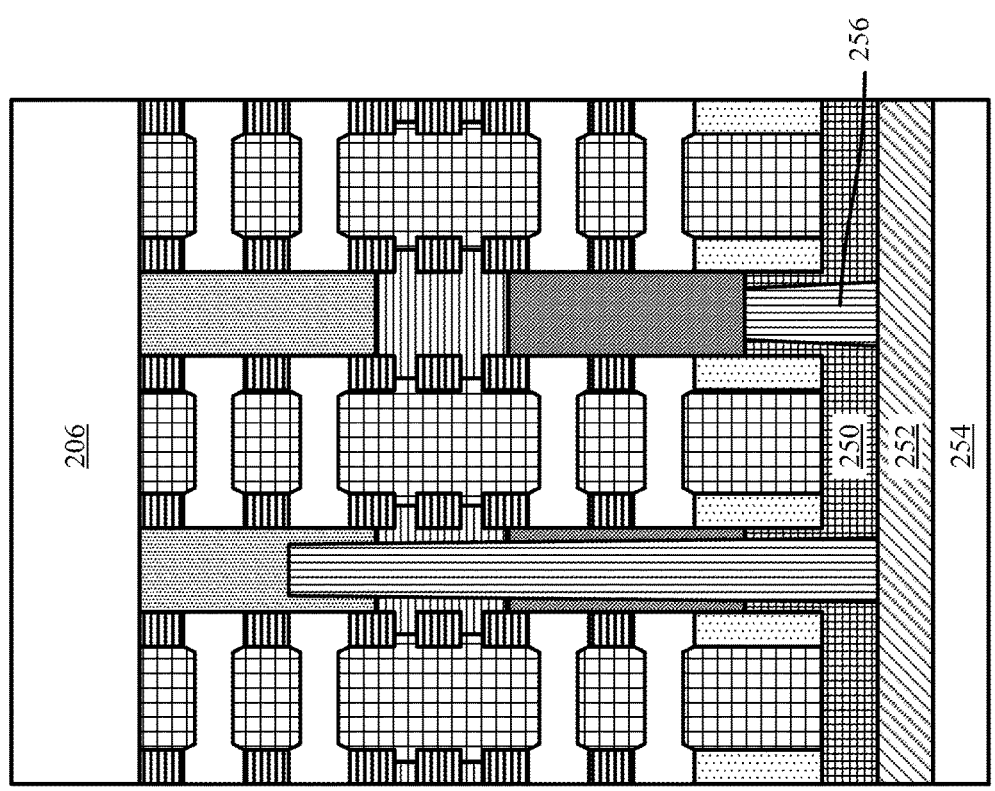
FIG. 16A
FIG. 16B

STACKED FIELD-EFFECT TRANSISTORS

BACKGROUND

The present invention relates in general to semiconductor fabrication methods and resulting structures. More specifically, the present invention relates to stacked field-effect transistors (FET) and methods of forming the same.

A stacked FET is a transistor architecture where the idea is to stack both n-type FET (nFET) and p-type FET (pFET) on each other. A stacked FET can stack one nFET on top of a pFET transistor, or one pFET on top of a nFET transistor, or one nFET over anther nFET, or one pFET over another PFET. Since a stacked FET stacks two devices on each other, the transistor provides benefits related to area.

SUMMARY

Embodiments of the present invention include fabrication methods and the corresponding structures. Some embodiments of the present disclosure include a stacked field-effect transistor (FET). The stacked FET comprises a top device, a bottom device, and a transition region between the top device and the bottom device. The transition region includes a plurality of inner spacers and a first inter-layer dielectric (ILD). The ILD is formed between each of the plurality of inner spacers. The top and bottom devices have a first channel sheet thickness in a gate region and a second channel sheet thickness between inner spacers. The second channel sheet thickness is larger than both the first channel sheet thickness and the first distance.

Additional embodiments of the present disclosure include a fabrication method. The fabrication method comprises forming a nanosheet stack on top of a substrate. The nanosheet stack includes a plurality of semiconductor layers separated by sacrificial layers. The nanosheet stack has a top region, a middle region, and a bottom region. The semiconductor layers in the top region have a first thickness, the semiconductor layers in the middle region have a second thickness, and the semiconductor layers in the bottom region having a third thickness. The second thickness is smaller than both the first and third thicknesses. The method further comprises patterning the nanosheet stack to form a plurality of nanosheet fins. The method further comprises indenting the sacrificial layers in between the nanosheet fins. The method further comprises forming inner spacers in the indents in the sacrificial layers. The method further comprises forming one or more bottom source/drain epitaxies between the nanosheet fins in the bottom region. The method further comprises indenting the semiconductor layers in the middle region. The method further comprises forming a bottom inter-layer dielectric (ILD) on the one or more bottom source/drain epitaxies. The bottom ILD fills in the indents in the semiconductor layers. The method further comprises forming one or more top source/drain epitaxies on top of the bottom ILD. The method further comprises forming a top ILD on the one or more top source/drain epitaxies. The method further comprises removing the sacrificial layers. The method further comprises trimming the semiconductor layers such that the semiconductor layers in the middle region are removed and the semiconductor layers in the top and bottom regions are thinned. The method further comprises forming a metal gate around the semiconductor layers.

Further embodiments of the present disclosure include a second fabrication method. The second fabrication method comprises forming a top device comprising a first plurality of channel sheets separated by inner spacers and a metal gate. The second fabrication method further comprises forming a transition region. The transition regions includes a plurality of inner spacers separated by a first distance and a first inter-layer dielectric (ILD) formed between each of the plurality of inner spacers. The second fabrication method further comprises forming a bottom device comprising a second plurality of channel sheet separated by inner spacers and a metal gate. The top and bottom devices have a first channel sheet thickness in a gate region and a second channel sheet thickness between the inner spacers. The second channel sheet thickness is larger than both the first channel sheet thickness and the first distance.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIGS. 12A-12B illustrate cross-sectional views of the semiconductor device of FIGS. 11A-11B following the performance of additional fabrication operations, in accordance with embodiments of the present disclosure.

FIGS. 16A-16B illustrate cross-sectional views of the semiconductor device of FIGS. 15A-15B following the performance of additional fabrication operations, in accordance with embodiments of the present disclosure.

Figure 1:
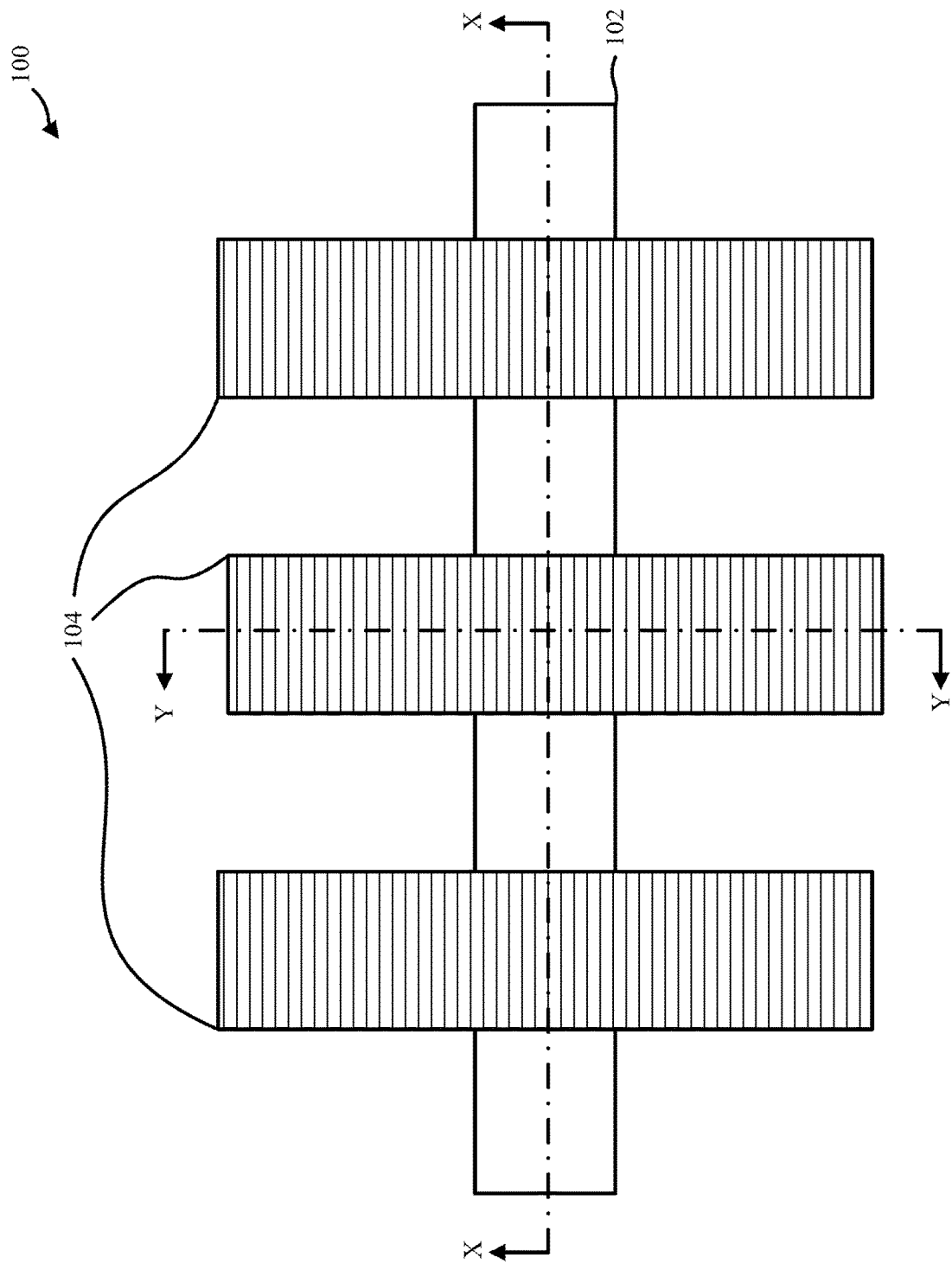
FIG. 1 depicts a plan view of an example semiconductor structure indicating a X-X cross-section location and a Y-Y cross section location for each of the following figures, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to stacked field-effect transistors (FETs) and methods of making the same. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For purposes of the description hereinafter, when a first surface is referred to as being arranged "opposite" to a second surface, the first surface is different from the second surface, and the first surface is spaced apart from the second surface. For instances in which the surfaces are substantially planar, the first surface is substantially parallel to the second surface.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist.

To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, an integrated circuit (IC) is a set of electronic circuits on one small flat piece (or "chip") of semiconductor material. More specifically, large numbers of tiny transistors can be integrated into a small chip, and interconnects can be used to connect two or more circuit elements (such as transistors) on the chip together electrically. This results in circuits that are orders of magnitude smaller, faster, and less expensive than those constructed of discrete electronic components.

The field-effect transistor (FET) is a type of transistor that uses an electric field to control the flow of current in a semiconductor. FETs are devices with three terminals: a source, a gate, and a drain. FETs control the flow of current by the application of a voltage to the gate, which in turn alters the conductivity between the drain and source. More specifically, the FET controls the flow of electrons (or holes) from the source to drain by affecting the size and shape of a conductive channel created and influenced by voltage (or lack of voltage) applied across the gate and source terminals. (For simplicity, this discussion assumes that the body and source are connected.) This conductive channel is the stream through which electrons flow from source to drain.

FETs are also known as unipolar transistors since they involve single-carrier-type operation. In other words, a FET uses either electrons or holes as charge carriers in its operation, but not both. The source/drain of a FET is doped to produce either an n-type semiconductor (in which case the FET can be referred to as an NFET) or a p-type semiconductor (in which case the FET can be referred to as a PFET). When the voltage applied to the gate of the FET is larger than the threshold voltage, the charge carriers in the channel region of the FET are built up, which activates the FET (e.g., allowing current to flow between the source and the drain).

Many different types of field effect transistors exist. A gate-all-around (GAA) FET is a non-planar (3D) transistor designed such that the gate material surrounds the channel region on all sides. Accordingly, the contact between the gate and the channel is increased, which provides better electrical control over the channel. A GAAFET can be a PFET or an NFET. A gate-all-around n-type semiconductor may also be referred to herein as a GAA NFET. Similarly, a gate-all-around p-type semiconductor may also be referred to herein as a GAA PFET.

A complementary field-effect transistor (CFET) utilizes GAAFETs vertically stacked on top of one another to reduce the amount of space required to accommodate multiple transistors. In particular, in a CFET, GAAFETs of opposite polarity are vertically stacked on top of one another. For example, a GAA PFET can be vertically stacked on top of an GAA NFET, or a GAA NFET can be vertically stacked on top of a GAA PFET.

Once stacked, a pair including a GAA PFET and an GAA NFET can be functionally interconnected and utilized as a complementary metal-oxide-semiconductor (CMOS) cell. In a CMOS cell, complementary pairs of PFETs and NFETs are used for logic functions.

One benefit of stacked FET technologies/architectures (e.g., CFETs) is that stacking transistors can permit smaller scale devices. However, interconnecting stacked transistors and CMOS cells can become complicated and congested, which can lead to reliability issues and/or may require additional space to accommodate interconnection structures. For example, one of the key challenges with stacked FETs is that without enough separation between the top device and the bottom device, top-to-bottom source/drain epitaxy shorting can occur. Furthermore, work function metal patterning undercut may occur when the top device and bottom device are too close.

In order to address these concerns, the sacrificial layer thickness between the top and bottom devices is often made larger during initial stack formation in order to increase the separation between the top and bottom devices in the resulting semiconductor device. However, this creates numerous issues during inner spacer indenting and depositing. For example, simply increasing the sacrificial layer thickness can result in microloading and uniformity issues. Furthermore, with a larger sacrificial layer, the amount of inner spacer material that must be deposited is also larger (e.g., 20 nm of spacer needed for a 40 nm space). Due to small gate pitch (e.g., the space between the neighboring gates), it is often not possible to deposit such the amount of spacer without pinching off the space.

Embodiments of the present disclosure may overcome these and other drawbacks of existing solutions by incorporating sacrificial semiconductor layers (e.g., Si) in the region between the top and bottom device. The sacrificial semiconductor layers are thinner than the actual channel semiconductor layers, which are made larger than normal to withstand the semiconductor etching that is performed during removal of the sacrificial semiconductor layers. Otherwise, the sacrificial semiconductor layers may be the same as the semiconductor layers that are used to create the channels of the semiconductor device. The use of sacrificial semiconductor layers removes issues related to increasing the thickness of the sacrificial layer between the top and bottom devices by reducing the risk of microloading during inner spacer etching and reducing the amount of inner spacer that must be deposited after indentation. This results in increased uniformity of the inner spacer, less gate pinchoff, and reduces the need for complicated inner spacer etchback.

Embodiments of the present disclosure include a semiconductor device having one or more stacked FETs and methods of fabricating the same. The semiconductor device comprises a top FET stacked over a bottom FET. Each FET has a first channel thickness under the gate region and a second channel gate thickness between the inner spacers. The second channel sheet thickness is larger than the first channel sheet thickness. Additionally, the semiconductor device has a transition region between the top and bottom FETs. The transition region separates the top and bottom FETs. In the transition region, an interlayer dielectric (ILD) is formed between inner spacers. The thickness of the ILD between the inner spacers in the transition region is smaller than the second channel thickness.

Additionally embodiments of the present disclosure are directed to a fabrication method for fabricating a semiconductor device. The fabrication method comprises forming a bottom nanosheet stack with alternating semiconductor layers with a first thickness (first semiconductor layers) and sacrificial (e.g., SiGe) layers. The method further comprises forming a middle nanosheet stack with alternating semiconductor (e.g., Si) layers with a second thickness (second semiconductor layers, also referred to herein as sacrificial semiconductor layers) and sacrificial (e.g., SiGe) layers. The method further comprises forming a top nanosheet stack with alternating semiconductor layers with a third thickness (third semiconductor layers) and sacrificial (e.g., SiGe) layers. The first and third thicknesses are greater than the second thickness.

After forming the complete nanosheet stack, the method comprises forming dummy gates. The method further comprises indenting the second sacrificial layer and forming inner spacers in the indented regions. The method further comprises forming the bottom source/drain epitaxy. The method further comprises indenting the sacrificial semiconductor layers in the middle nanosheet stack and forming the bottom ILD.

After forming the bottom ILD, the method comprises forming the top source/drain epitaxy and a top ILD. The method further comprises removing the dummy gates and the sacrificial layers. The method further comprises trimming the semiconductor layers such that the sacrificial semiconductor layers in the middle nanosheet stack are completely removed. This will also thin the exposed portions of the first and third semiconductor layers, while other portions (e.g., those between the inner spacers) will remain relatively unaffected.

It is to be understood that as used herein, "an embodiment" means one or more embodiments that share a common aspect. For example, "a first embodiment" may include one or more embodiments that are related in that they all share a first common aspect, function, and/or feature. Likewise, "a second embodiment" may include one or more embodiments that are related in that they all share a second common aspect, function, and/or feature. Furthermore, a particular embodiment that has both the first common aspect, function, and/or feature and the second common aspect, function, and/or feature may be considered to be both a first embodiment and a second embodiment.

Figure 2:
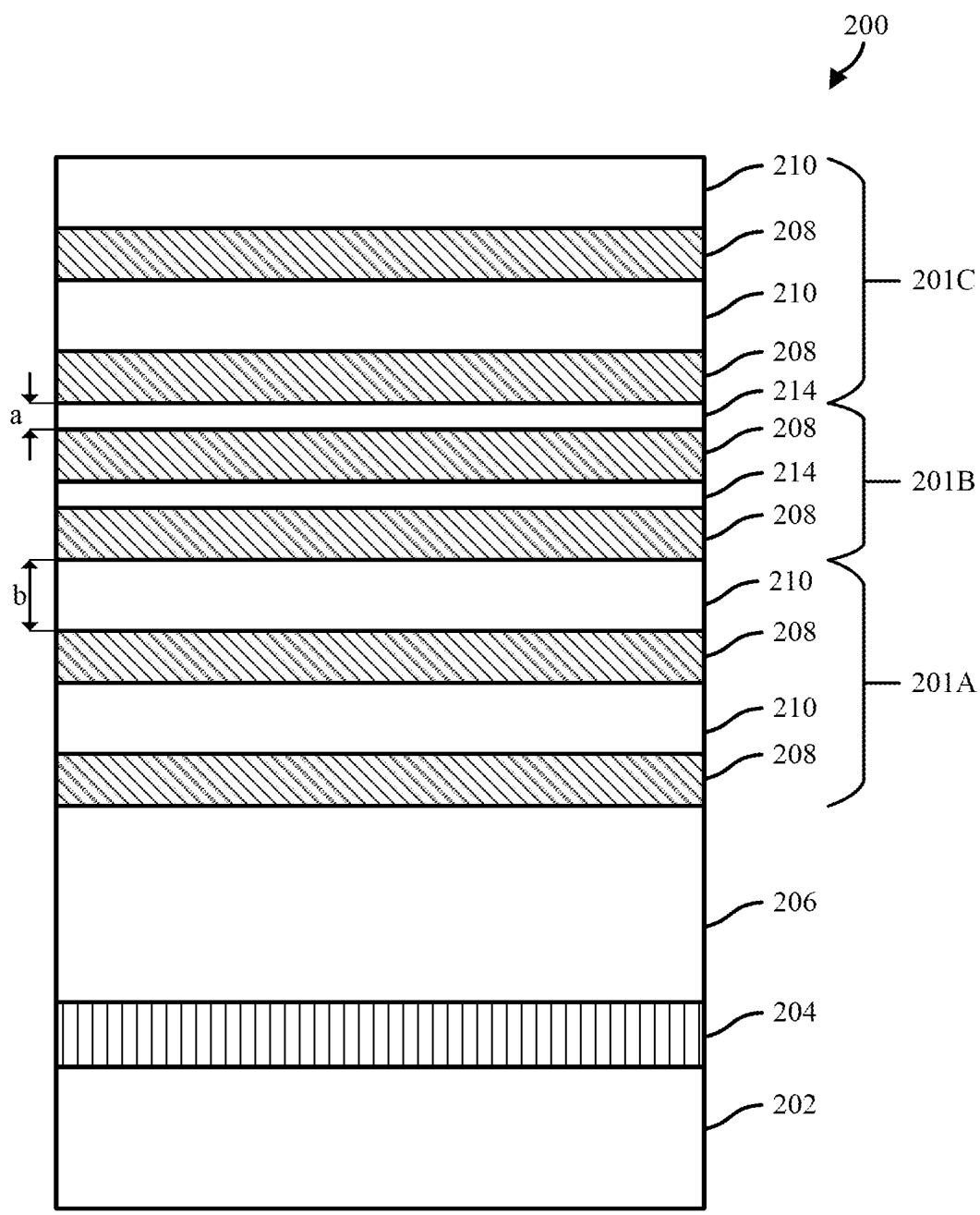
FIG. 2 illustrates a cross-sectional view of an example semiconductor component at an intermediate stage in the fabrication process, in accordance with embodiments of the present disclosure.

Turning now to the figures, FIG. 1 illustrates a plan view of the semiconductor device after fabrication as well as the location of the X-X and Y-Y cross sections. FIGS. 2-18B illustrate the semiconductor device at various intermediate stages in the fabrication process, in accordance with some embodiments of the present disclosure. In FIGS. 3A-18B, the X-X cross sectional views are shown in the figures that end with the letter A (e.g., FIGS. 3A, 4A, 5A, etc.), and the Y-Y cross sectional views are shown in the figures that end with the letter B (e.g., FIGS. 3B, 4B, 5B, etc.). In FIG. 2, the semiconductor device is identical along both the X-X and Y-Y cuts, so only a single cross-sectional view is shown.

Referring first to FIG. 1, shown is a plan view of an example semiconductor structure 100, in accordance with embodiments of the present disclosure. The semiconductor structure 100 includes a plurality of gate regions 104 that cross an active region 102. Between the gate regions 104 are source/drain epitaxy regions, as discussed herein.

FIG. 1 further shows lines indicating the X-X cross-section location and the Y-Y cross section location for each of the following figures. In the following figures, the X-X cross section runs across the gates and shows the source/drain epitaxy regions during fabrication of the semiconductor structure 100, whereas the Y-Y cross section is along a gate 104 and shows the gate regions during fabrication of the semiconductor structure 100.

Referring now to FIG. 2, shown in an example semiconductor device 200 at an intermediate stage of fabrication, in accordance with embodiments of the present disclosure. In particular, FIG. 2 shows the semiconductor device 200 after the starting layers have been formed for a stacked nanosheet FET. The semiconductor device 200, at this stage, comprises a substrate 202 (e.g., Si) with an etch stop layer 204 formed thereon. The etch stop layer 204 may be any suitable etch stop, such as a buried oxide (BOX) or SiGe. As shown in FIG. 2, the etch stop layer 204 is disposed inside of the substrate 202 such that there is an additional portion 206 of the substrate above the etch stop layer 204.

The bottom nanosheet stack 201A is formed on top of the substrate 206. The bottom nanosheet stack 201A comprises one or more layers that will be used to form the bottom FET. In particular, the bottom nanosheet stack 201A includes alternating layers of a sacrificial material and a semiconductor. In other words, the bottom nanosheet stack 201A includes alternating sacrificial layers 208 and semiconductor layers 210. The semiconductor layers 210 may be, for example, Si layers. The sacrificial layers 208 may be, for example, SiGe layers.

The semiconductor layers 210 may have a thickness b, as shown in FIG. 2. The thickness b of the deposited semiconductor layers 210 may be larger than the ultimate thickness of the semiconductor layers 210 in the final semiconductor device 200. This is because, as discussed in more detail below, one of the subsequent fabrication operations performed on the semiconductor device 200 is a semiconductor thinning operation. Accordingly, the deposited semiconductor layers 210 may be made thicker such that after thinning, they have the intended size. For example, if the intended size of the semiconductor layers 210 in the final device is 6 nm, the deposited semiconductor layers 210 may be 9 nm thick.

The middle nanosheet stack 201B is formed on top of the bottom nanosheet stack 201A. The middle nanosheet stack 201B comprises one or more layers that are used to create a transitional region that separates the bottom FET from the top FET. Like the bottom (and top) nanosheet stacks, the middle nanosheet stack 201 includes alternating layers of a sacrificial material and a semiconductor. However, unlike the bottom (and top) nanosheet stacks, the semiconductor layers in the middle nanosheet stack 201B are sacrificial layers that will be removed in subsequent processing steps. In other words, the middle nanosheet stack 201B also includes alternating sacrificial layers 208 and sacrificial semiconductor layers 214. The sacrificial layers 208 may be, for example, SiGe layers.

The sacrificial semiconductor layers 214 may have a thickness a, as shown in FIG. 2. The thickness a of the sacrificial semiconductor layers 214 is smaller than the thickness b of the deposited semiconductor layers 210. This is because, as discussed in more detail below, one of the subsequent fabrication operations performed on the semiconductor device 200 is a semiconductor thinning operation to remove the sacrificial semiconductor layers 214 while leaving behind the semiconductor layers 210 to create channels for the top and bottom FETs. Accordingly, the sacrificial semiconductor layers 214 are thinner than the deposited semiconductor layers 210 such that after thinning, the sacrificial semiconductor layers 214 are completely removed and the deposited semiconductor layers 210 largely remain. For example, if the intended size of the semiconductor layers 210 in the final device is 6 nm and the deposited semiconductor layers 210 is 9 nm thick, the thickness 1 of the sacrificial semiconductor layers 214 may be 3 nm.

Finally, the top nanosheet stack 201C is formed on top of the middle nanosheet stack 201B. The top nanosheet stack 201C comprises one or more layers that will be used to form the top FET. In particular, the top nanosheet stack 201C includes alternating layers of a sacrificial material and a semiconductor. In other words, the top nanosheet stack 201C includes alternating sacrificial layers 208 and semiconductor layers 210. The semiconductor layers 210 may be, for example, Si layers. The sacrificial layers 208 may be, for example, SiGe layers, such as high-Ge % SiGe layer (e.g., SiGe55%) or a low-Ge % SiGe (e.g., SiGe30%).

The semiconductor layers 210 of the top nanosheet stack 201C may have the same thickness b as the semiconductor layers 210 of the bottom nanosheet stack 201A. However, in some embodiments, the thickness of the semiconductor layers 210 of the top nanosheet stack 201C may be larger than or smaller than the thickness b of the semiconductor layers 210 of the bottom nanosheet stack 201A, depending on the desired thickness of the channels in the top FET. In any case, the thickness of the semiconductor layers 210 of the top nanosheet stack 201C is larger than the thickness of the sacrificial semiconductor layers 214 of the middle nanosheet stack 201B. This ensures that the thinning process that is used to remove the sacrificial semiconductor layers 214 does not also completely remove the semiconductor layers 210 of the top nanosheet stack 201C. Accordingly, the deposited semiconductor layers 210 of the top nanosheet stack 201C may be made thicker such that after thinning, they have the intended size. For example, if the intended size of the semiconductor layers 210 in the final device is 6 nm, the deposited semiconductor layers 210 may be 9 nm thick.

Figure 3B:
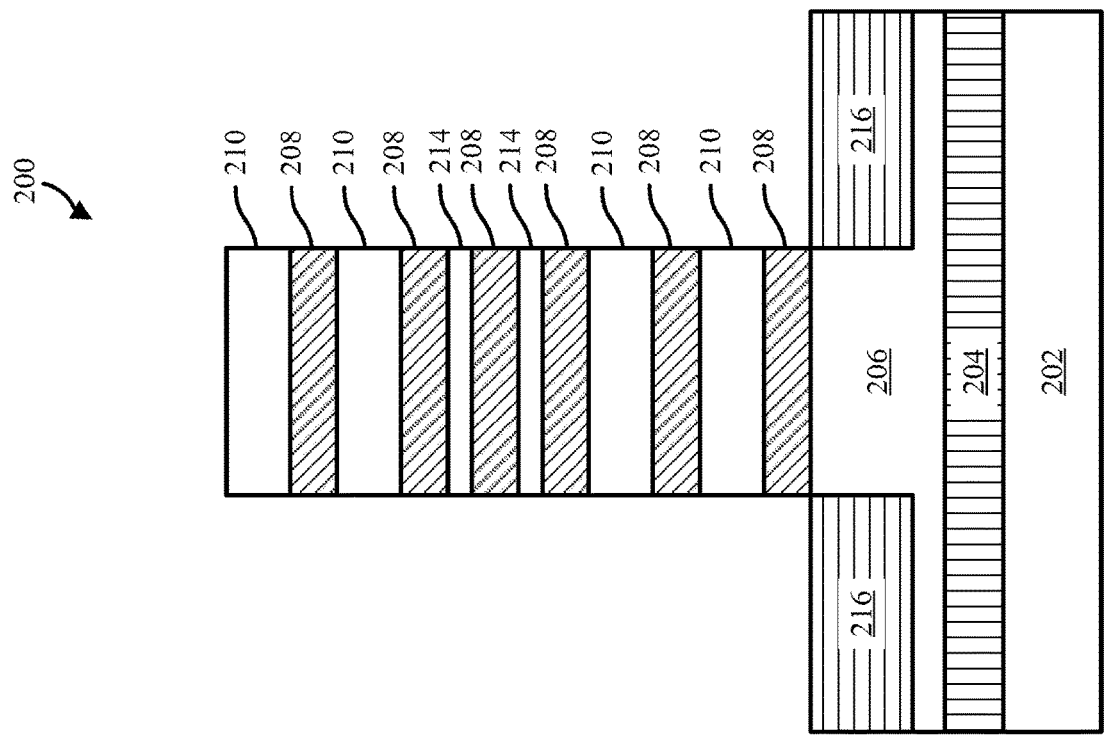
FIGS. 3A-3B illustrate cross-sectional views of the semiconductor device of FIG. 2 following the performance of additional fabrication operations, in accordance with embodiments of the present disclosure.
Figure 3A:
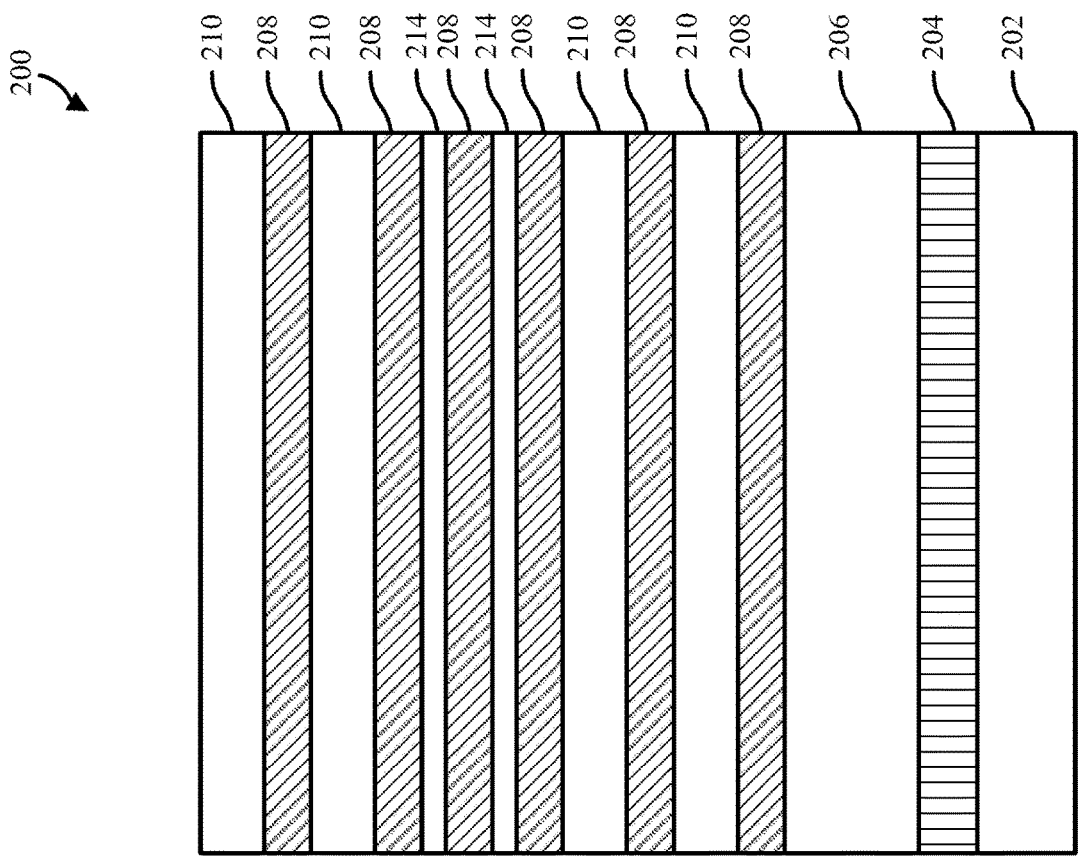

After creating the complete nanosheet stack 201, a hardmask may be deposited on a portion of the stack, and the stack may be patterned as shown in FIGS. 3A-3B. In particular, as shown in FIG. 3A, at this stage, the nanosheet stack may not be patterned at all in the cross-gate cut region. However, as shown in FIG. 3B, the sides may be patterned in the region that runs along the gate to create a patterned stack. Additionally, as shown in FIG. 3B, a shallow trench isolation (STI) layer 216 is formed on portions of the substrate 402 that are lateral to the patterned stack. The STI 216 may prevent electric current leakage between the semiconductor device 200 and adjacent semiconductor devices. In some embodiments, the STI 216 may be an oxide.

Figure 4B:
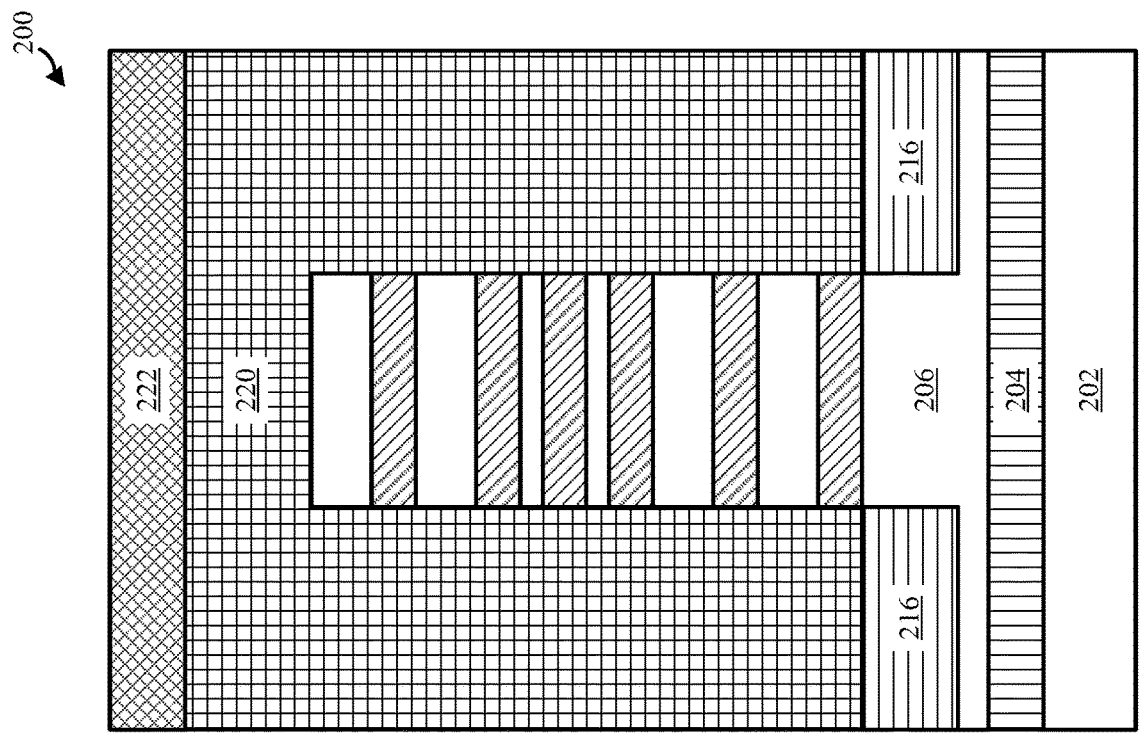
FIGS. 4A-4B illustrate cross-sectional views of the semiconductor device of FIGS. 3A-3B following the performance of additional fabrication operations, in accordance with embodiments of the present disclosure.
Figure 4A:
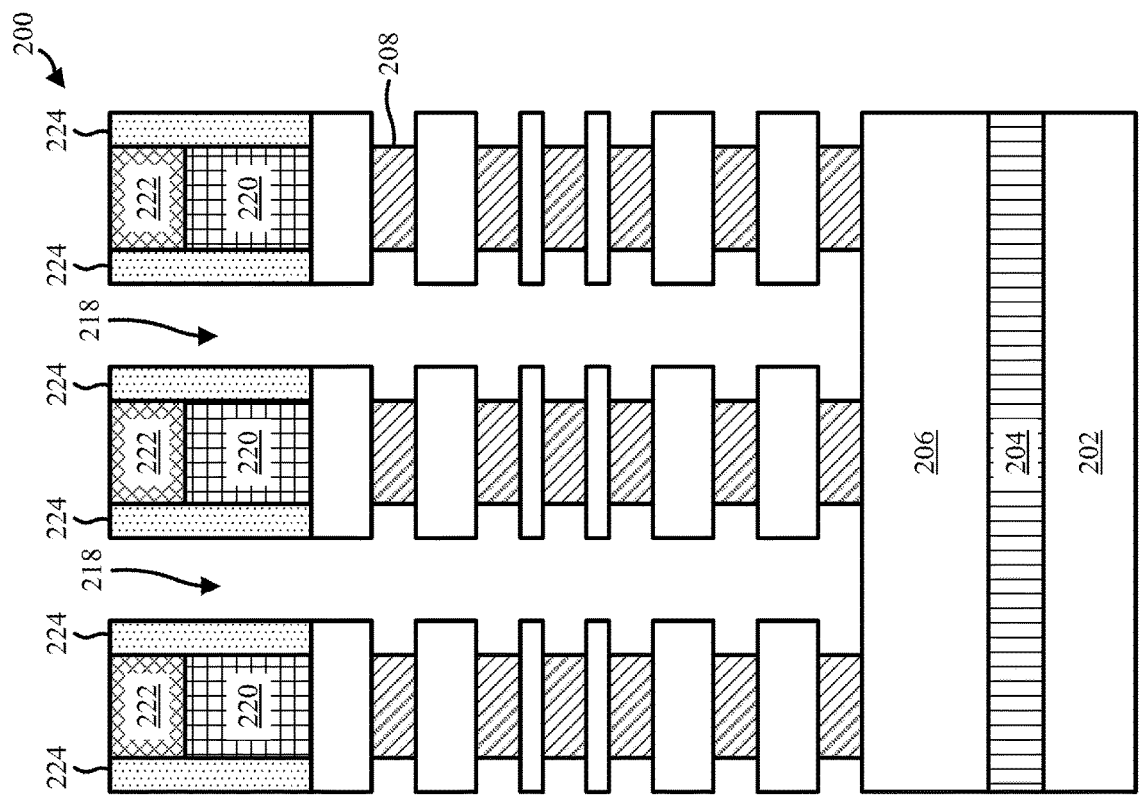

After forming the STI 216, gate patterning, inner spacer formation, nanosheet recessing, and sacrificial (e.g., SiGe) indentation is performed. The results of these operations are illustrated in FIGS. 4A and 4B. The dummy gate 220 and gate hardmask 222 are deposited on top of the nanosheet stack. This is followed by a patterning process to define the gate region. The dummy gates 220 may be made of any suitable material as would be recognized by a person of ordinary skill in the art. In some embodiments, the dummy gates 220 are a thin layer of SiO2 plus bulk amorphous silicon (a-Si). In the across-gate region shown in FIG. 4A, the dummy gates 220 and hardmask 222 is surrounded on the lateral sides by spacer layers 224. The nanosheet stack is then recessed to form regions 218 (also referred to as trenches) between the spacer layers 224. The trenches 218 may be formed all the way down to the substrate 206. After recessing the nanosheet stack, the sacrificial layers 208 are indented in the across-gate region shown in FIG. 4A.

Figure 5B:
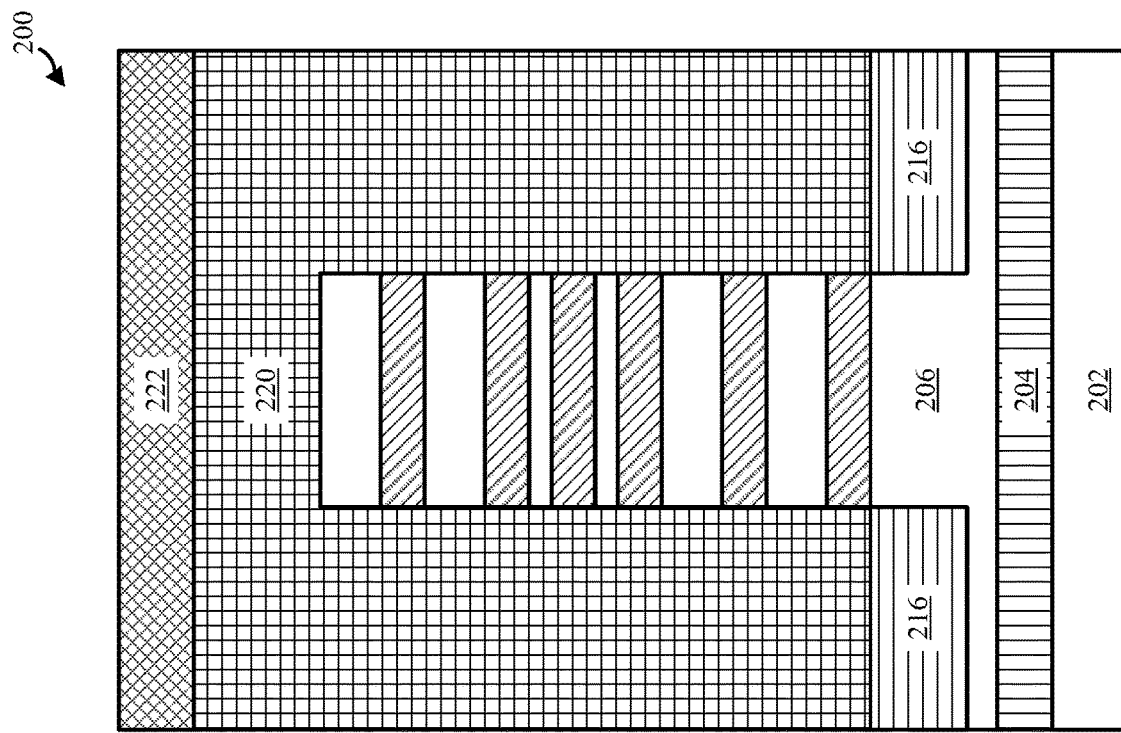
FIGS. 5A-5B illustrate cross-sectional views of the semiconductor device of FIGS. 4A-4B following the performance of additional fabrication operations, in accordance with embodiments of the present disclosure.
Figure 5A:
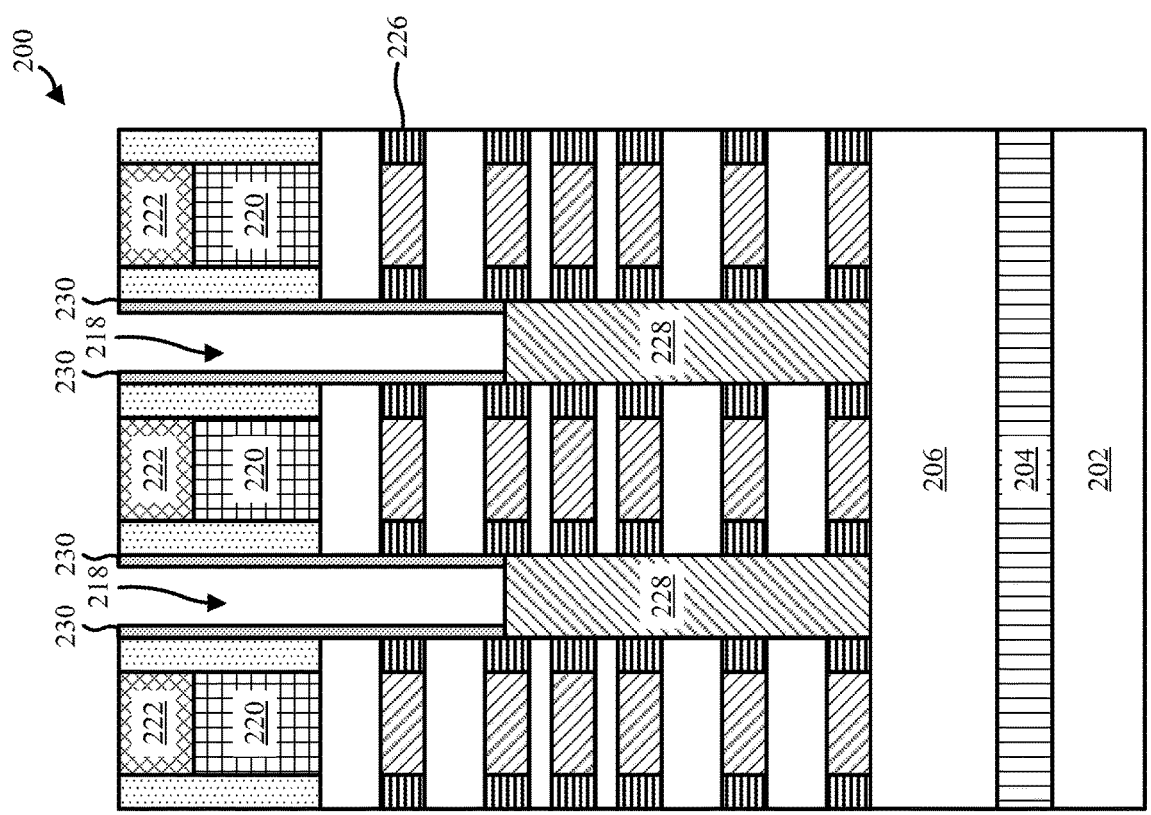

Referring now to FIGS. 5A-5B, after indenting the sacrificial layers 208, inner spacers 226 are formed in the indented regions. The one or more inner spacers 226 may be deposited on the sidewalls of the nanosheet stack in the source/drain epitaxy region (i.e., in the across-gate region shown in FIG. 5A). The inner spacers 226 may be made out of, for example, SiC, AlOx, $SiO_2$, SiOCN, SiOC, SiBCN. In some embodiments, an isotropic etching operation may be performed to remove the inner spacers 226 from other surfaces (such as top of gate HM, sidewall of the spacer 224, over substrate 206, etc.).

After forming the inner spacers 226, an organic planarization layer (OPL) 228 is filled in the trenches 218. Then, an OPL recess process is formed to recess the OPL 228 such that top nanosheet stack portion of the semiconductor device 200 is exposed. As shown in FIG. 5A, this results in the OPL 228 being deposited between the nanosheets of the bottom device (i.e., the bottom FET) and the transitional layer (i.e., the layer separating the bottom device from the top device).

After recessing the OPL 228, a top protective spacer 230 is formed along the sidewalls of the top nanosheet stack (where the top device will be located) in the trench 218 regions. The top protective spacers 230 may be made out of, for example, SiC, AlOx, SiO$_2$, SiOCN, SiOC, SiBCN. In some embodiments, an RIE operation may be performed to remove any excess portion of the top protective spacer 230 that is deposited on top of the OPL 228, such as any portion that is not along the sidewalls of the top device.

Figure 6B:
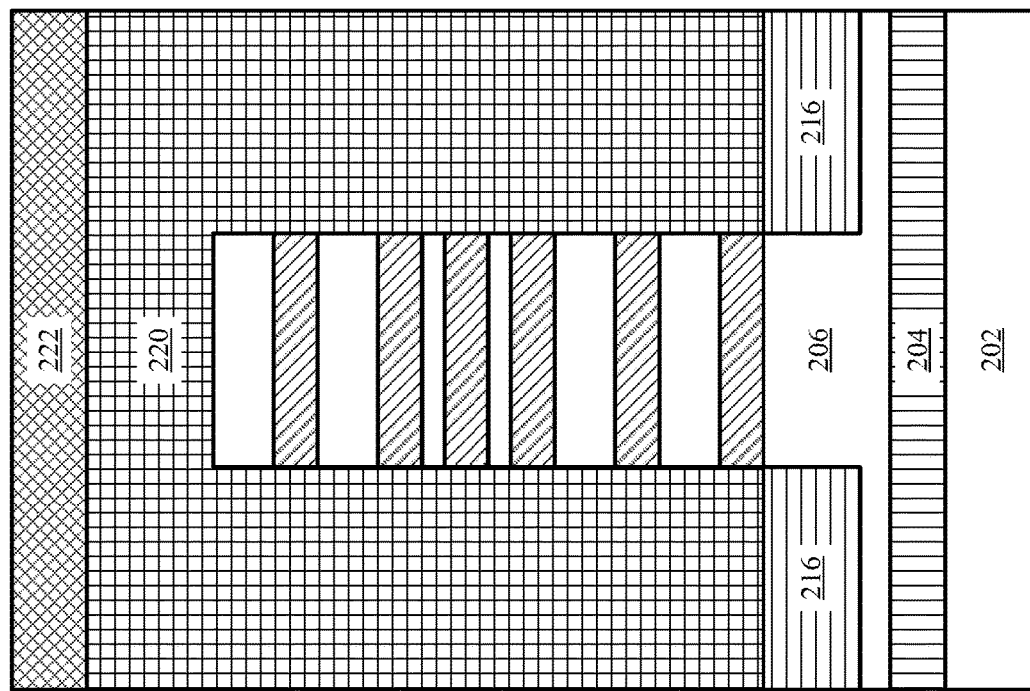
FIGS. 6A-6B illustrate cross-sectional views of the semiconductor device of FIGS. 5A-5B following the performance of additional fabrication operations, in accordance with embodiments of the present disclosure.
Figure 6A:
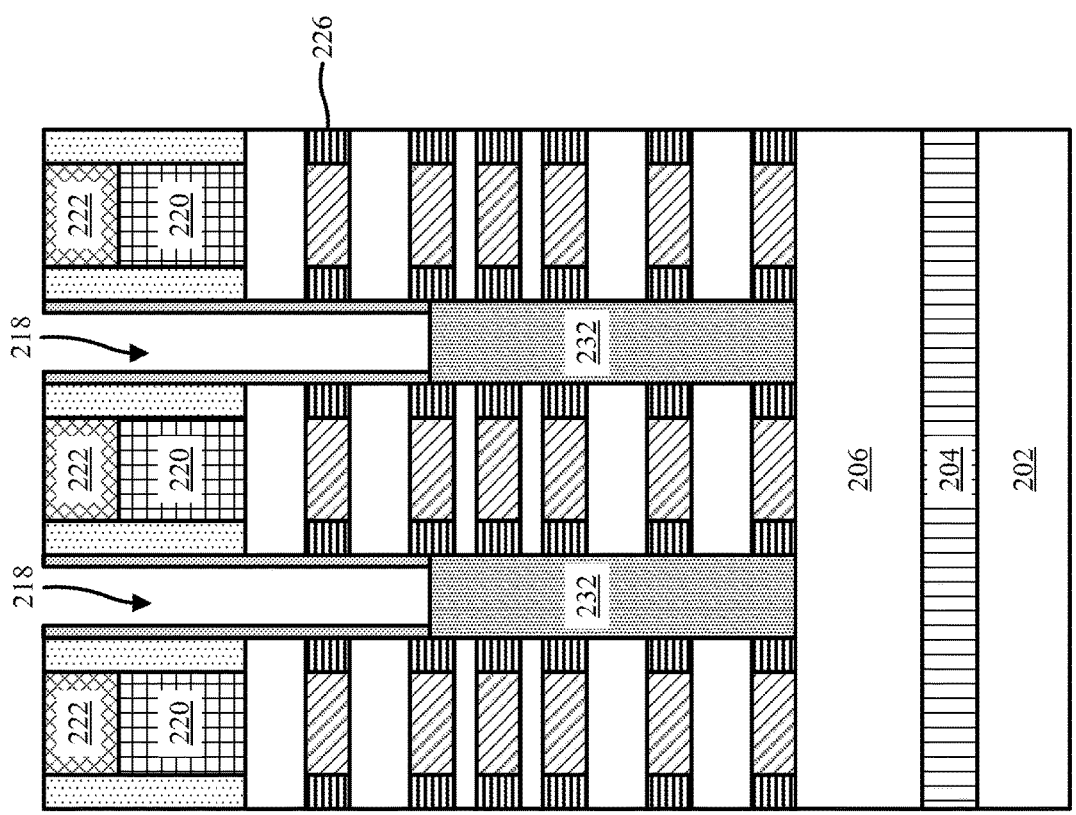

After depositing the top protective spacer 230, the OPL 228 is removed and the bottom source/drain epitaxy 232 is grown. This is shown in FIGS. 6A-6B. The bottom source/drain epitaxy 232 is the epitaxy layer for the bottom device/FET of the semiconductor device 200 (e.g., stacked FET). As shown in FIG. 6A, the bottom source/drain epitaxy 232 may be grown such that a top surface of the bottom source/drain epitaxy 232 is approximately flush with the bottom surface of the top protective spacer 230. Accordingly, the bottom source/drain epitaxy 232 may be grown until it is above the top sacrificial semiconductor layer 214, but below the bottom semiconductor layer 210 of the top device.

Figure 7B:
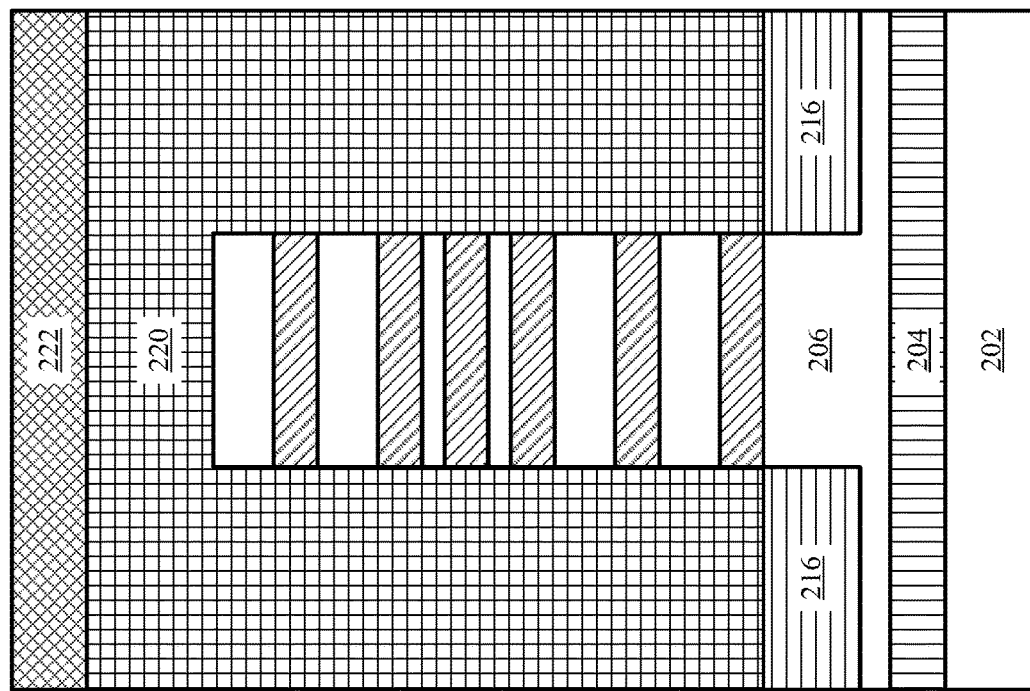
FIGS. 7A-7B illustrate cross-sectional views of the semiconductor device of FIGS. 6A-6B following the performance of additional fabrication operations, in accordance with embodiments of the present disclosure.
Figure 7A:
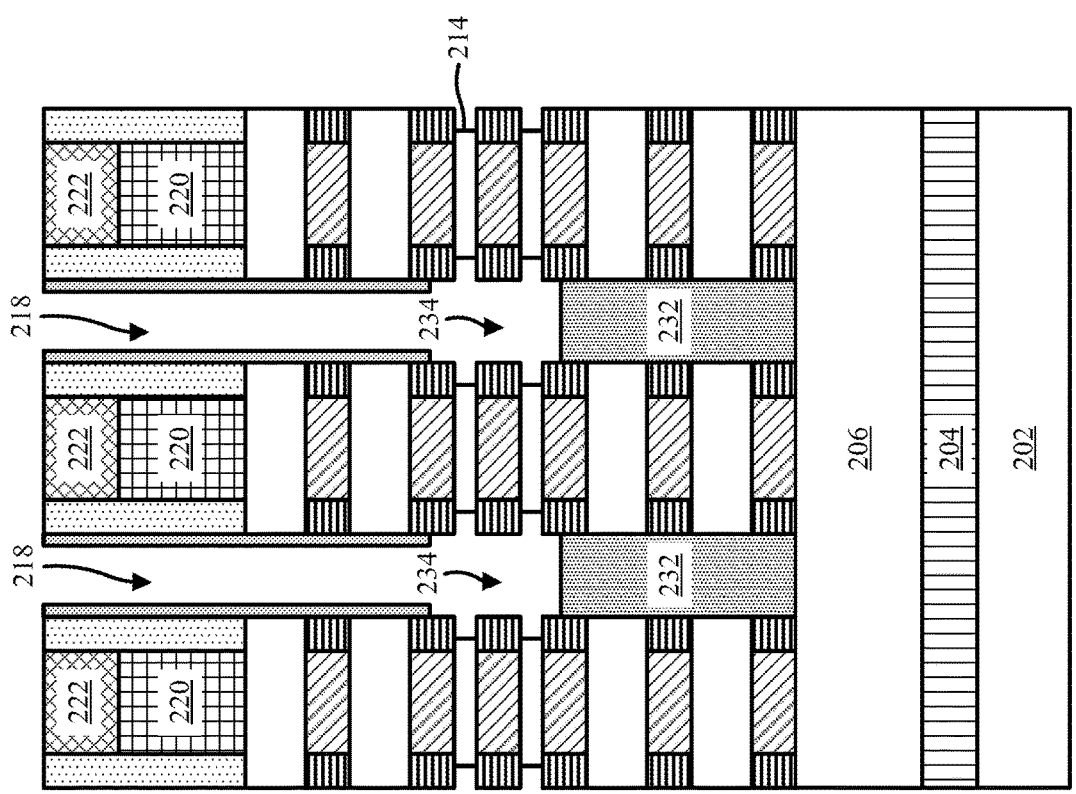

Referring now to FIGS. 7A-7B, after growing the bottom source/drain epitaxy 232, the recess operation is performed to recess the bottom source/drain epitaxy 232. The bottom source/drain epitaxy 232 is recessed such that the sidewalls of the sacrificial semiconductor layers 214 are exposed. A semiconductor indentation operation (e.g., Si indentation) is then performed to indent the sacrificial semiconductor layers 214. Together with the bottom source/drain epitaxy 232 recess, the semiconductor indentation operation creates voids 234 at the bottom of the trenches 218 and directly above the bottom source/drain epitaxy 232.

After performing the semiconductor indentation operation, the resulting voids 234 are filled with a bottom interlayer dielectric (ILD) 236 fill. The ILD 236 may cover the bottom source/drain epitaxy 232. Additionally, the bottom ILD 236 may fill in the areas left vacant by the semiconductor indentation operation such that the bottom ILD 236 touches the sidewalls of the sacrificial semiconductor layers 214 in the inter-gate region, as shown in FIG. 8A.

The bottom ILD 236 can include any suitable material(s) known in the art, such as, for example, porous silicates, carbon doped oxides, silicon dioxides, silicon nitrides, silicon oxynitrides, or other dielectric materials. The bottom ILD 236 can be formed using any method known in the art, such as, for example, chemical vapor deposition, plasma enhanced chemical vapor deposition, atomic layer deposition, or physical vapor deposition.

The bottom ILD 236 may be formed by first filling the voids 234 and at least a portion of the region between the top protective spacers 230. A recess operation may then be performed to remove the excess bottom ILD 236 from between the top protective spacers 230 such that the top of the bottom ILD 236 is at approximately the same level as the bottom of the top protective spacer 230.

After depositing and recessing the bottom ILD 236, the top protective spacers 230 are removed and the top source/drain epitaxy 238 is grown in the trenches 218.

The top and bottom source/drain epitaxies 232, 238 may have different types. For example, one of the source/drain epitaxy 232, 238 may be an nFET source/drain epitaxy, and the other source/drain epitaxy 232, 238 may be a pFET source/drain epitaxy, or both are nFET source/drain epitaxy or both are pFET source/drain epitaxy. The nFET and pFET source/drain epitaxy materials 232, 238 may be grown in a sequential operation (i.e., one after the other), and the bottom ILD 236 is deposited after bottom epitaxy 232 growth to cover it from shorting to top epitaxy 238, as shown in FIG. 8A.

Figure 8B:
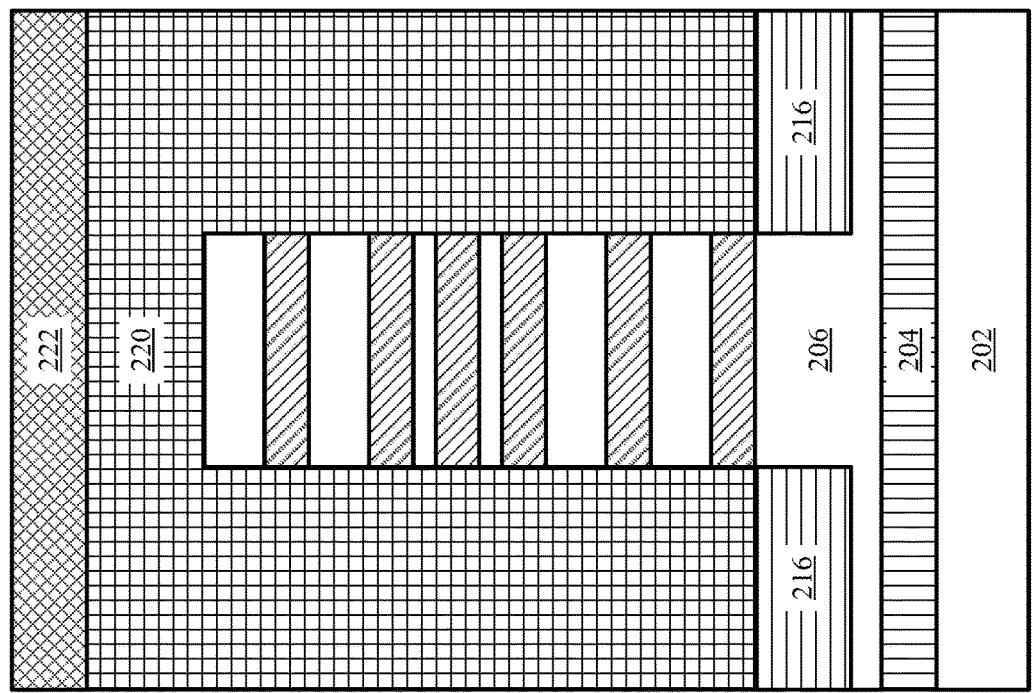
FIGS. 8A-8B illustrate cross-sectional views of the semiconductor device of FIGS. 7A-7B following the performance of additional fabrication operations, in accordance with embodiments of the present disclosure.
Figure 8A:
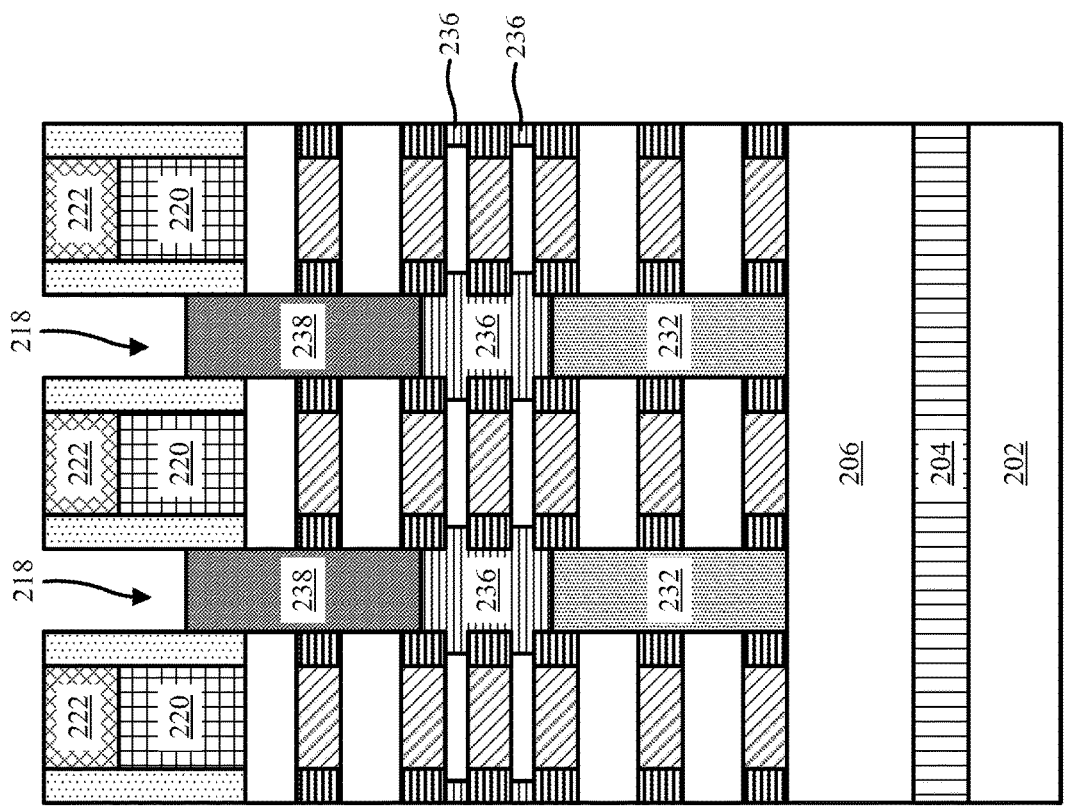
Figure 9B:
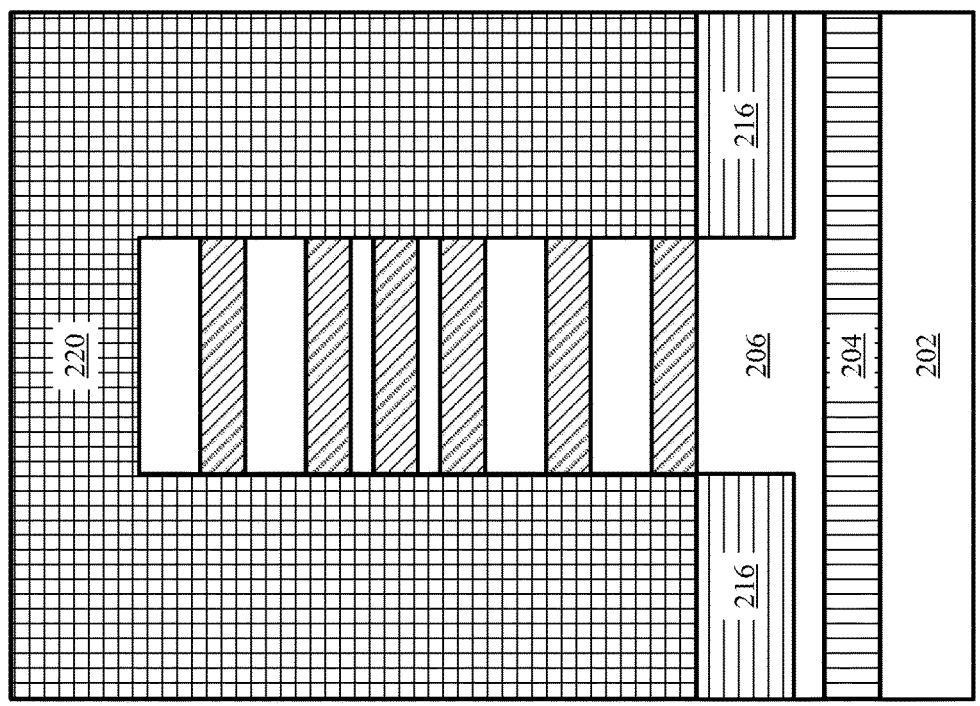
FIGS. 9A-9B illustrate cross-sectional views of the semiconductor device of FIGS. 8A-8B following the performance of additional fabrication operations, in accordance with embodiments of the present disclosure.
Figure 9A:
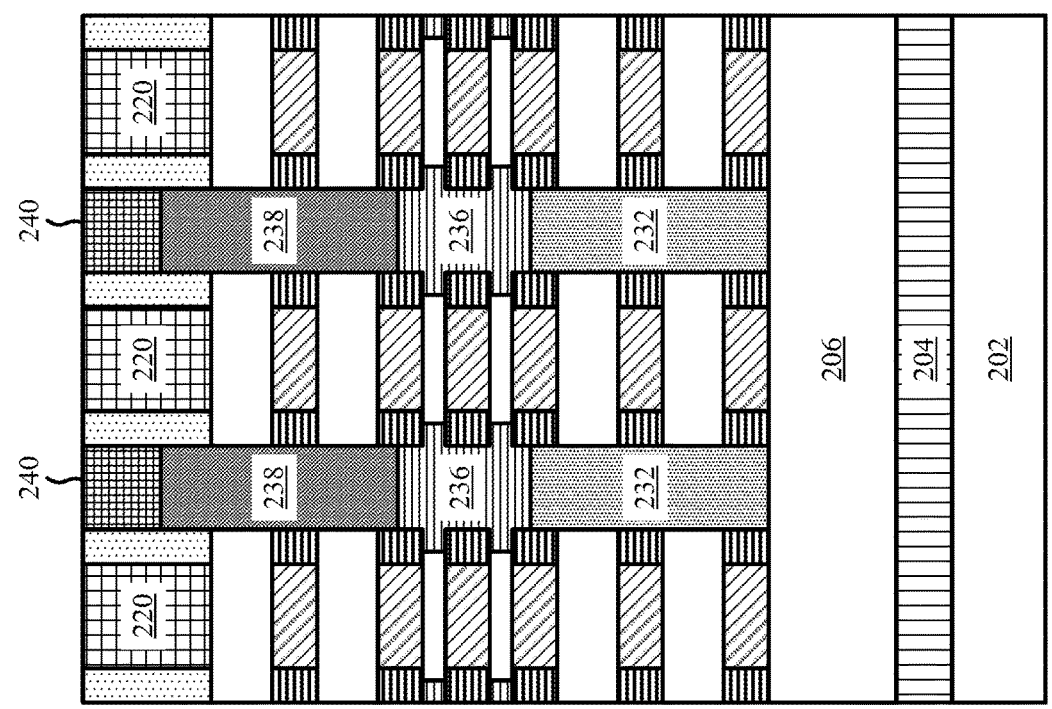

Referring now to FIGS. 9A and 9B, a top ILD 240 is then formed on top of the top source/drain epitaxy 238 in the trenches 218 (shown in FIGS. 8A-8B). The top ILD 240 may be the same dielectric material as was used for the bottom ILD 236, though in some embodiments, the top and bottom ILDs 236, 240 are made from different dielectric materials. A CMP or other planarization process may then be performed to remove the HM 222 and re-expose the tops of the dummy gates 220.

Figure 10B:
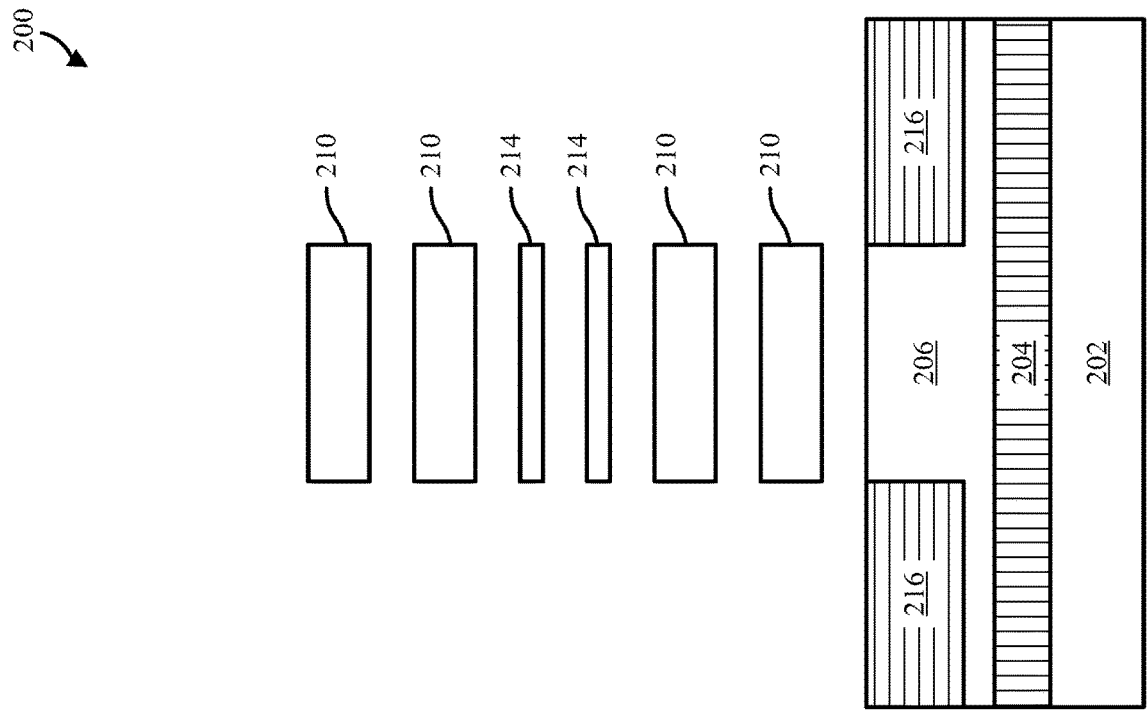
FIGS. 10A-10B illustrate cross-sectional views of the semiconductor device of FIGS. 9A-9B following the performance of additional fabrication operations, in accordance with embodiments of the present disclosure.
Figure 10A:
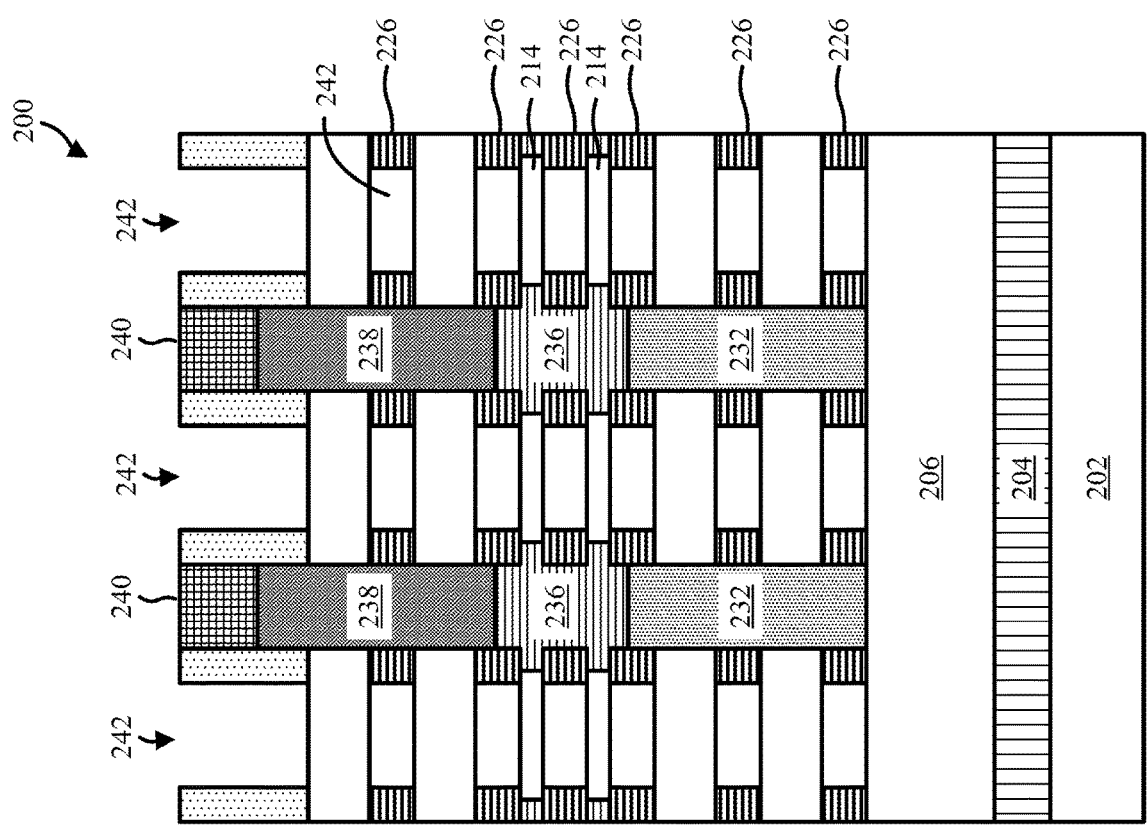

Next, the dummy gates 220 and the sacrificial layers 208 are removed. This is shown in FIGS. 10A-10B. As shown, removal of the dummy gates 220 and the sacrificial layers 208 results in a void 242 being left behind In addition to being at the top of the nanosheet stack, the void 242 is also found between the semiconductor layers 210 and the sacrificial semiconductor layers 214.

Figure 11B:
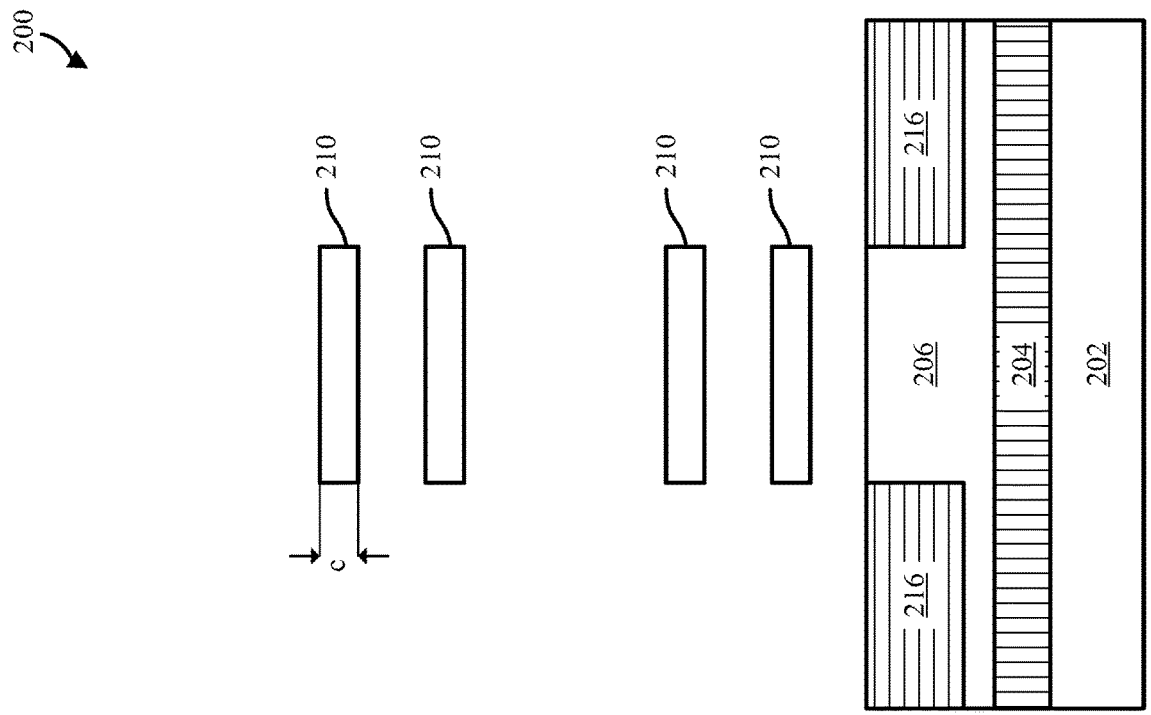
FIGS. 11A-11B illustrate cross-sectional views of the semiconductor device of FIGS. 10A-10B following the performance of additional fabrication operations, in accordance with embodiments of the present disclosure.
Figure 11A:
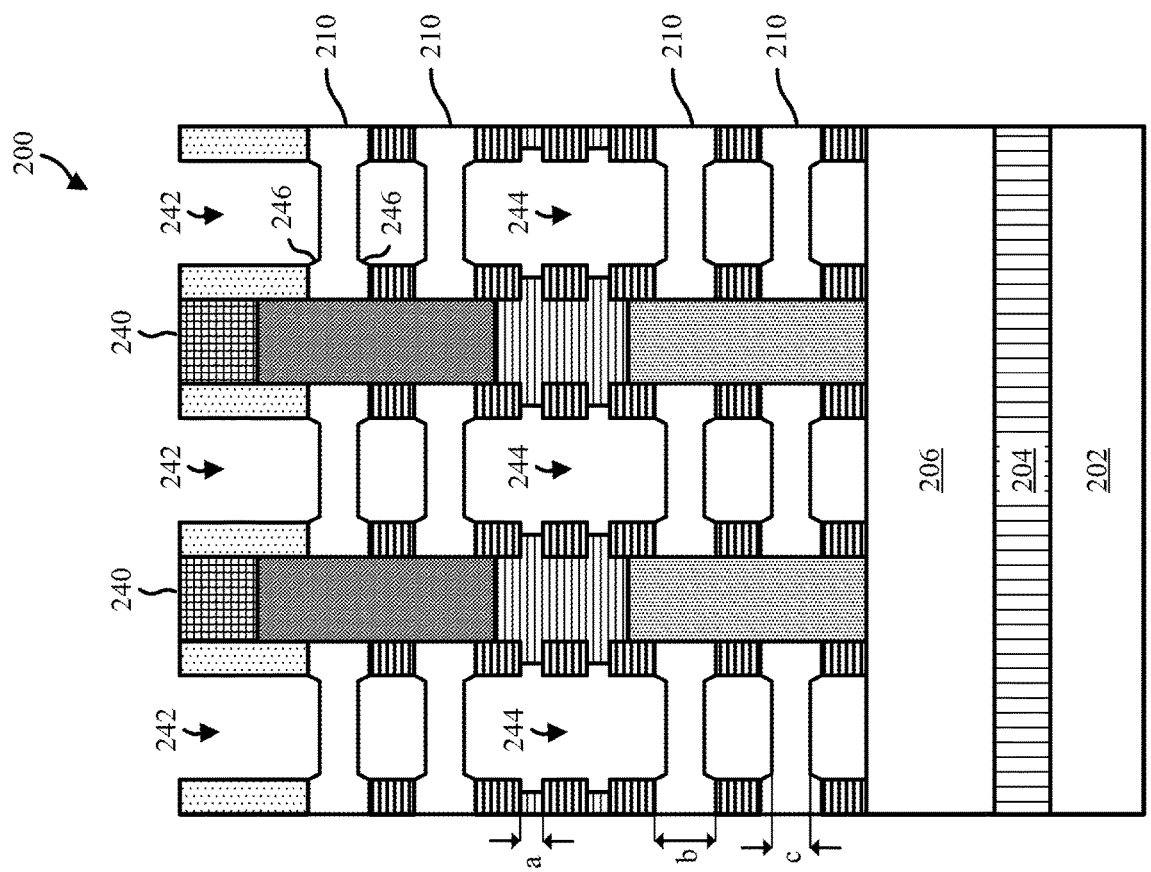

An Si trimming operation is then performed, as shown in FIGS. 11A-11B. The Si trimming operation completely removes the sacrificial semiconductor layers 214 and creates empty regions 244 in the transitional region (i.e., between the top and bottom devices). Additionally, the remaining semiconductor layers 210 are thinned by the trimming operation in areas where the semiconductor layers 210 were exposed. As such, in the inter-gate regions shown in FIG. 11A, the thickness c of the middle of the semiconductor layers 210 is smaller than the thickness b of the ends of the semiconductor layers 210, which were protected from the Si trimming operation by the inner spacers 226. This also results in cut edges 246. Meanwhile, in the gate region shown in FIG. 11B, the entirety of the semiconductor layers 210 were exposed. As such, the semiconductor layers 210 in this region have an essentially uniform thickness c in embodiments where the top and bottom device had identical starting thicknesses.

Next, the high-k dielectric and metal gate layer 248 is formed. This is shown in FIGS. 12A-12B. In other words, during this stage, a replacement high-k metal gate (HKMG) is formed in place of each dummy gate 220 and sacrificial layer 208, as well as in the areas where the sacrificial semiconductor layers 214 previously were. The high-k metal gate layer 248 can be any suitable gate dielectric materials, such as HfO2, ZrO2, HfSiOx, HfLaOx, HfAlOx, etc, followed by workfunction metals, such as TiN, TiC, TiAl, TiAlC, etc, followed by optional low resistance conducting metals such as W, Co and Ru.

Those skilled in the art will recognize that a "replacement metal gate" refers to a gate, which replaces a previously formed dummy gate (also referred to herein as a sacrificial gate, a non-active gate, or a non-gate) and becomes an active component of the semiconductor structure being formed. The work function metal can comprise a metal selected so as to have a specific work function appropriate for a given type FET (e.g., an N-type FET or a P-type FET). For example, for a silicon-based N-type FET, the work function metal can comprise hafnium, zirconium, titanium, tantalum, aluminum, or alloys thereof, such as hafnium carbide, zirconium carbide, titanium carbide, tantalum carbide, or aluminum carbide, so that the work function metal has a work function similar to that of N-doped polysilicon. For a silicon-based P-type FET, the work function metal can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the work function metal has a work function similar to that of P-doped polysilicon.

Figure 13B:
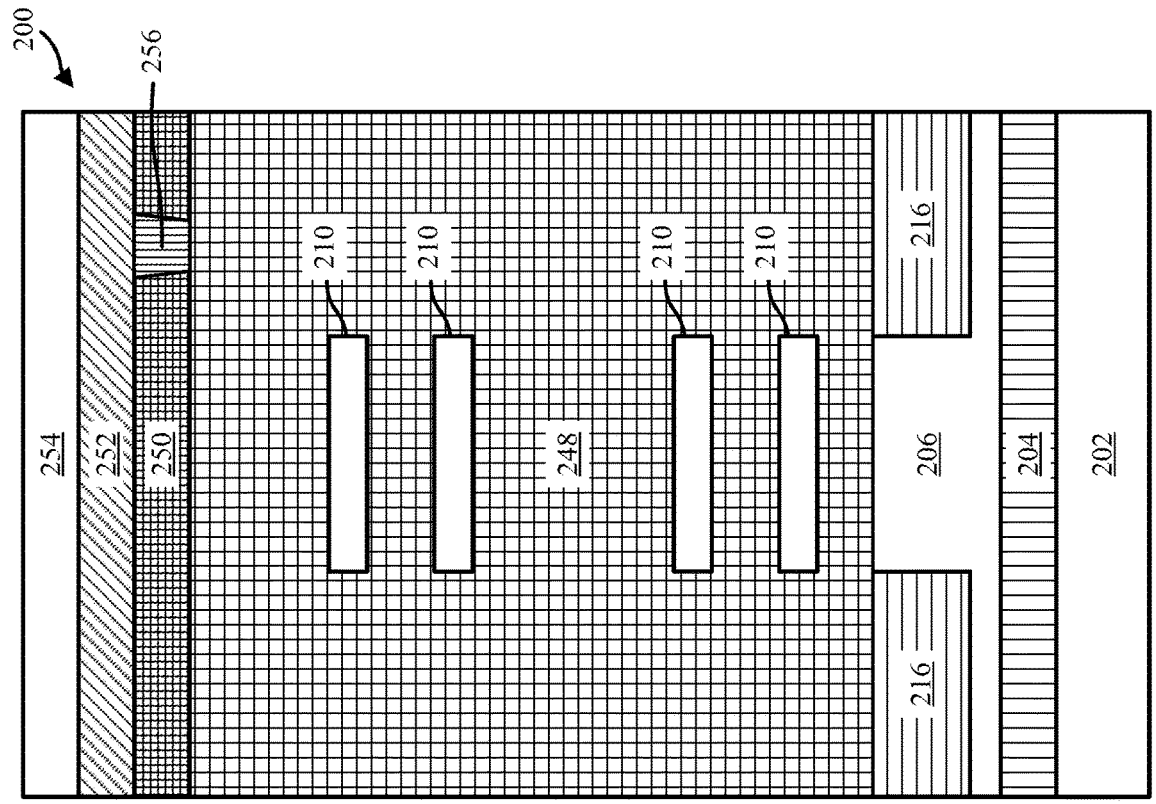
FIGS. 13A-13B illustrate cross-sectional views of the semiconductor device of FIGS. 12A-12B following the performance of additional fabrication operations, in accordance with embodiments of the present disclosure.
Figure 13A:
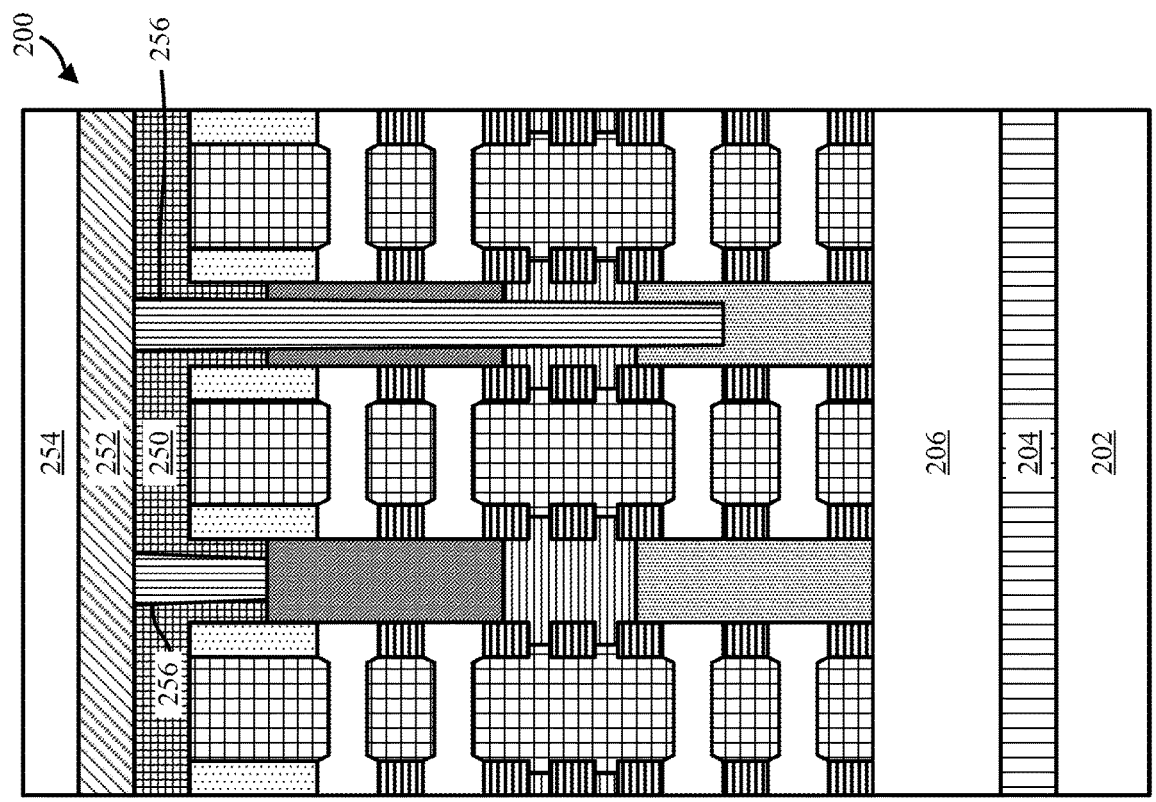

Next, the middle-of-line (MOL) and back-end-of-line (BEOL) 252 structures may be formed. The semiconductor device 200 may then be bonded to a carrier wafer 254. This is illustrated in FIGS. 13A-13B. The MOL structures may include one or more epitaxy and/or gate contacts 256, as well as another ILD layer 250 deposited on top of the semiconductor device 200 (e.g., as shown in FIG. 13B, in which an ILD layer 250 is on top of the metal gate 248). The epitaxy contacts 256 may be made out of any suitable material including, for example, a silicide liner at bottom of the contact such as Ti, Ni, NiTi, NiPt, and a conductive metal such as Ru or W, or Co, with a thin adhesion metal liner such as TiN. The BEOL 252 may include a number of interconnects or other structures.

It is to be understood that the dimensions of the MOL and BEOL 252 structures, as well as the carrier wafer 254, are not necessarily drawn to scale. The MOL and BEOL 252 structures and the carrier wafer 254 may be formed using any suitable processes, as would be recognized by a person of ordinary skill in the art. In some embodiments, BEOL 252 and carrier wafer 254 may be pre-fabricated and then bonded with the semiconductor device 200.

Figure 14B:
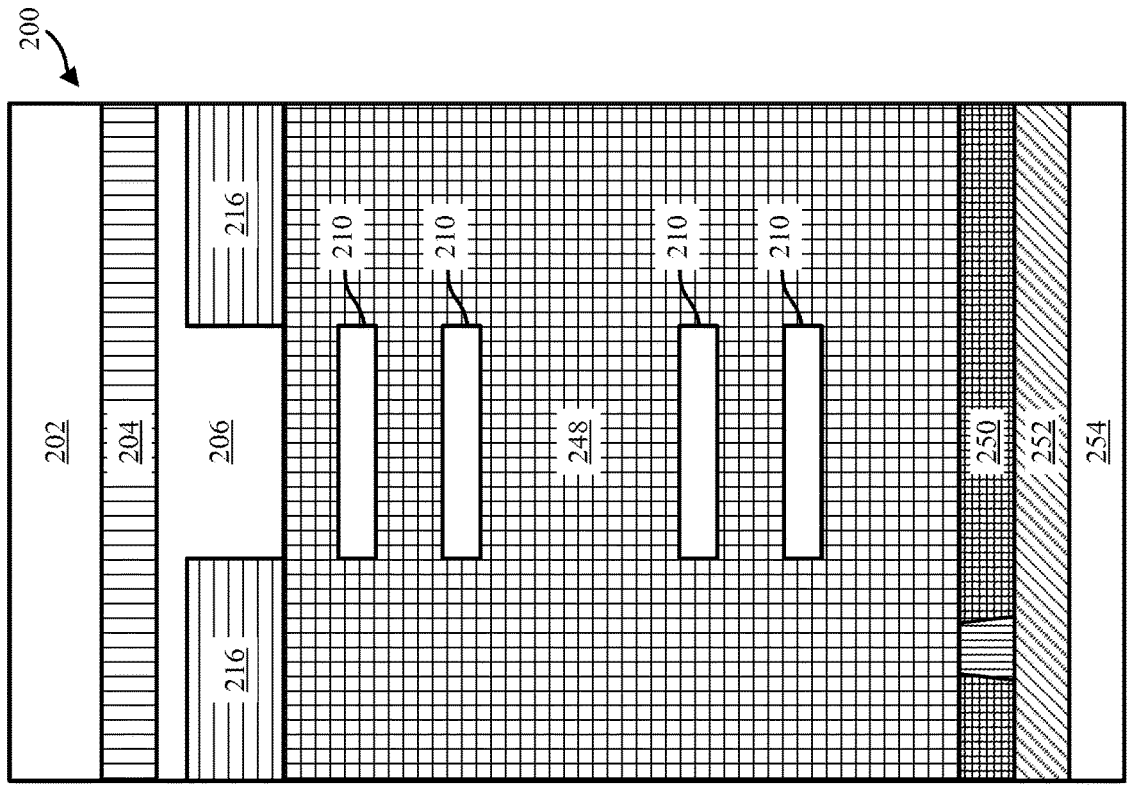
FIGS. 14A-14B illustrate cross-sectional views of the semiconductor device of FIGS. 13A-13B following the performance of additional fabrication operations, in accordance with embodiments of the present disclosure.
Figure 14A:
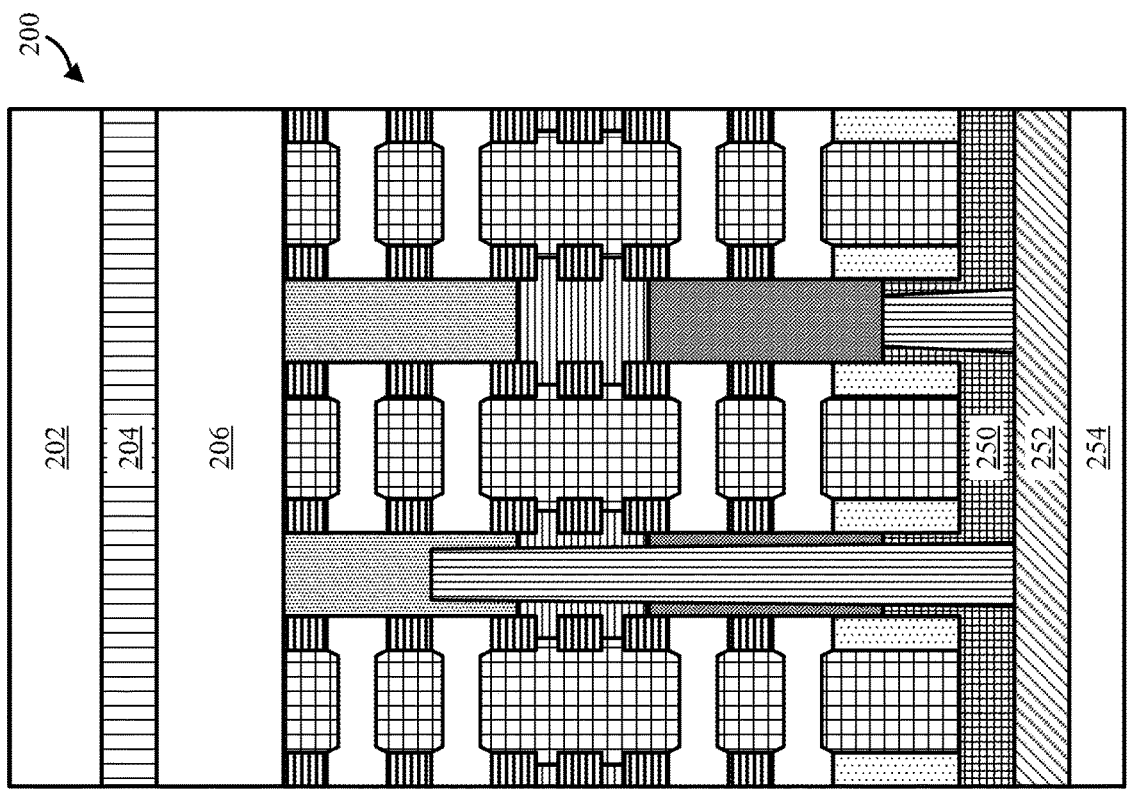
Figure 15A:
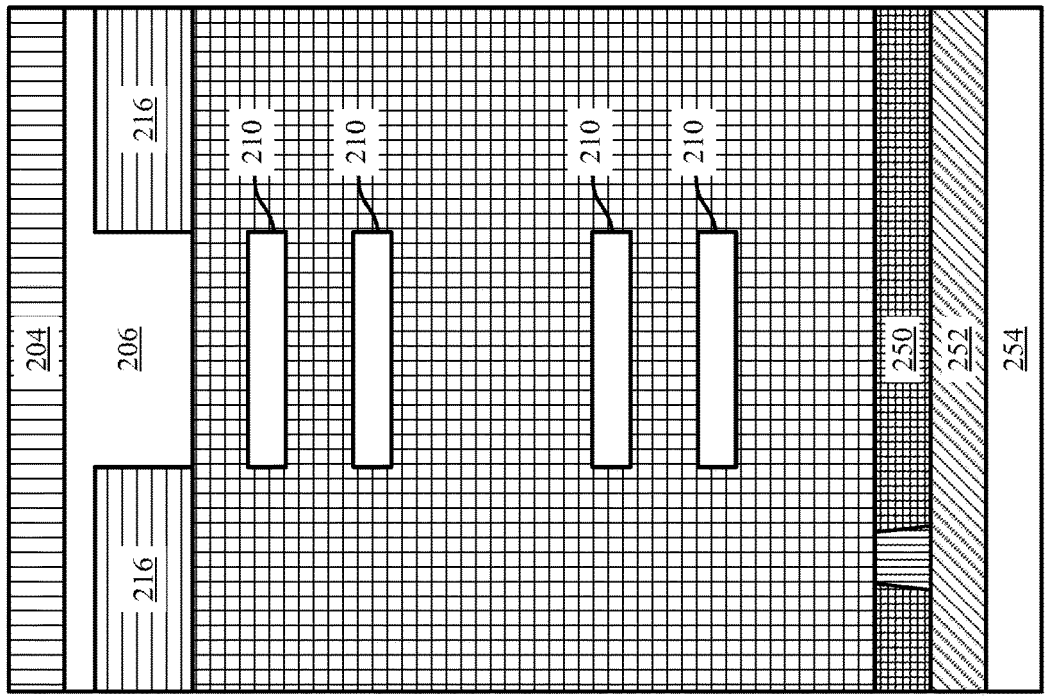
FIGS. 15A-15B illustrate cross-sectional views of the semiconductor device of FIGS. 14A-14B following the performance of additional fabrication operations, in accordance with embodiments of the present disclosure.
Figure 15B:
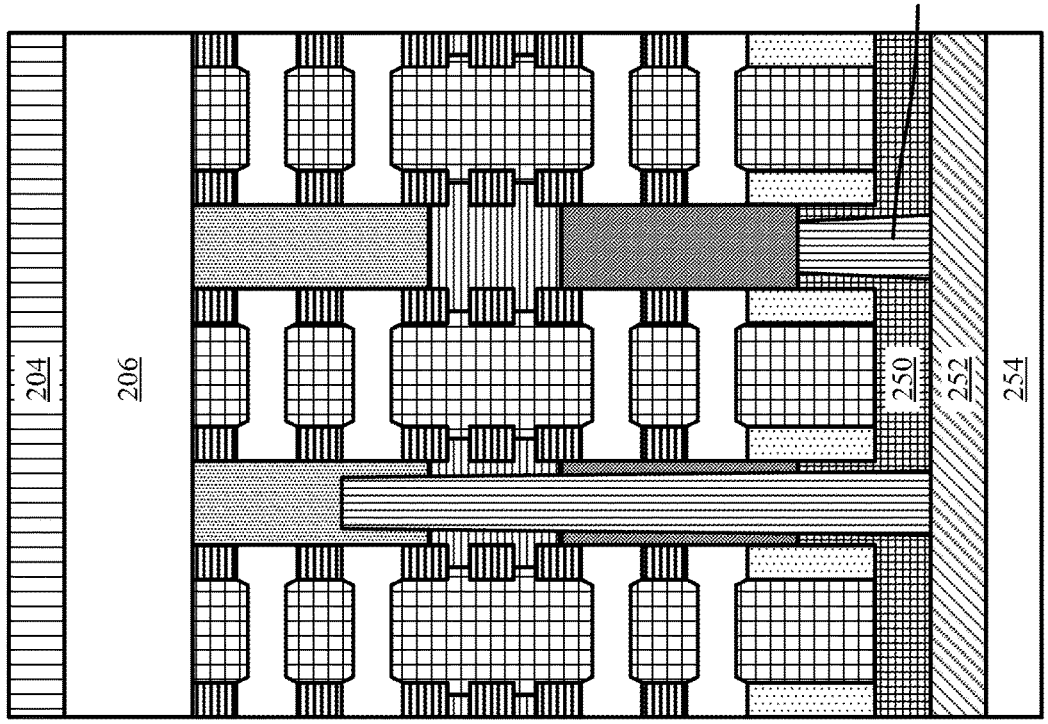
Figure 17B:
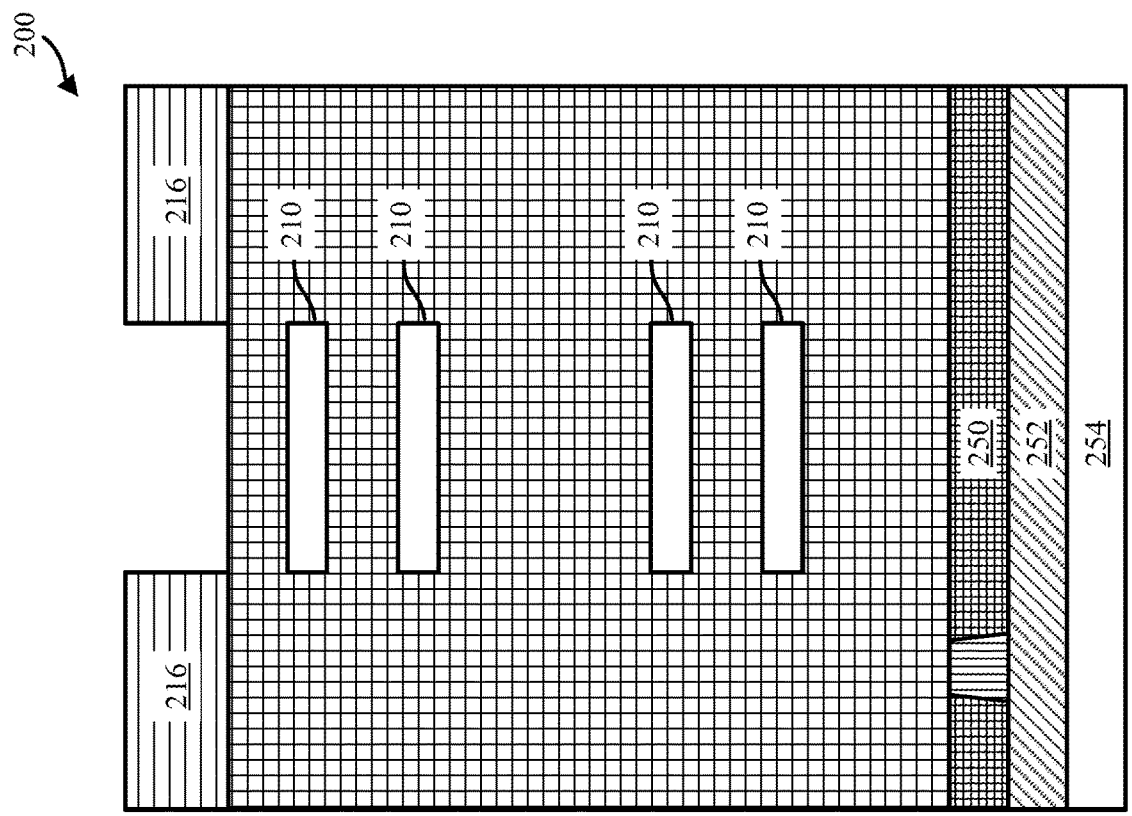
FIGS. 17A-17B illustrate cross-sectional views of the semiconductor device of FIGS. 16A-16B following the performance of additional fabrication operations, in accordance with embodiments of the present disclosure.
Figure 17A:
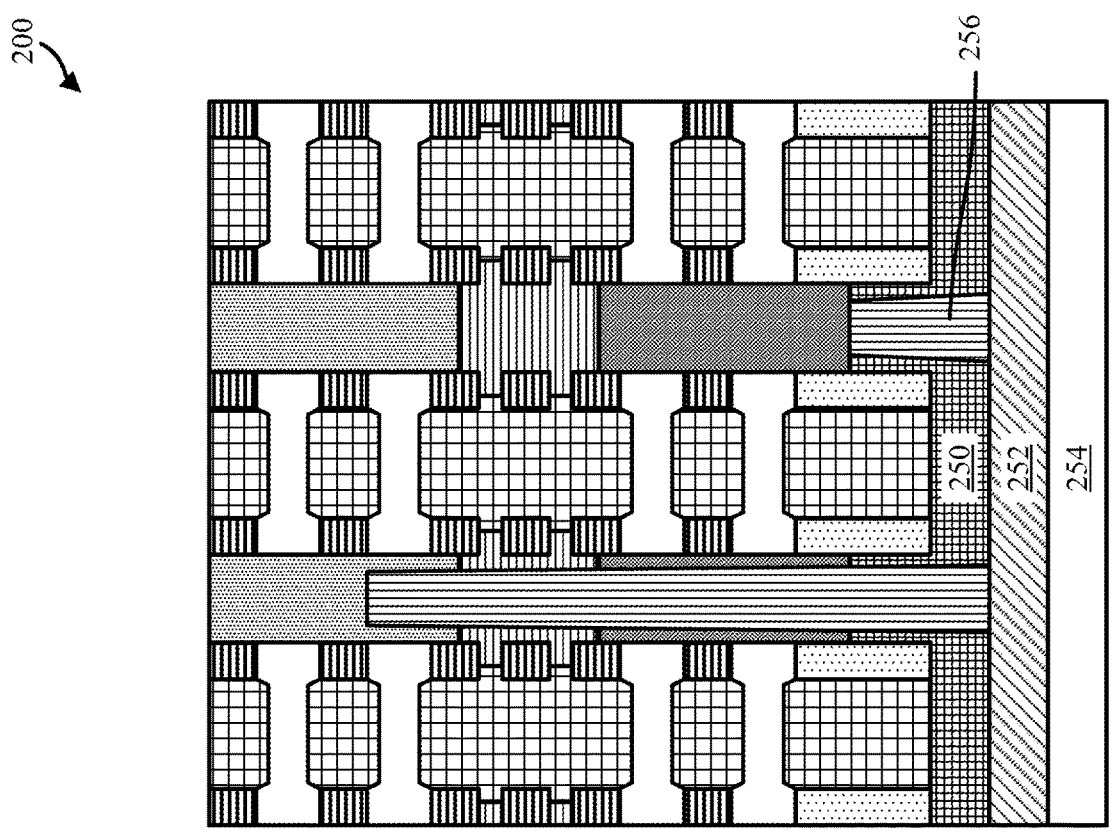

Next, the wafer is flipped. This is shown in FIGS. 14A-14B. After flipping the wafer, the substrate 202 is removed stopping at the etch stop 204. This is shown in FIGS. 15A-15B. The substrate 202 may be removed through a selective etching process that stops on the etch stop 204. Following removal of the substrate 202, the etch stop 204 is removed. This is shown in FIGS. 16A-16B. The remaining substrate 206 is then removed, as shown in FIGS. 17A-17B. Selective removal of the substrate 206 exposes the STI 216, the gate 248, the bottom source/drain epitaxy 232, and the inner spacers 226, as shown in FIGS. 17A-17B.

Figure 18A:
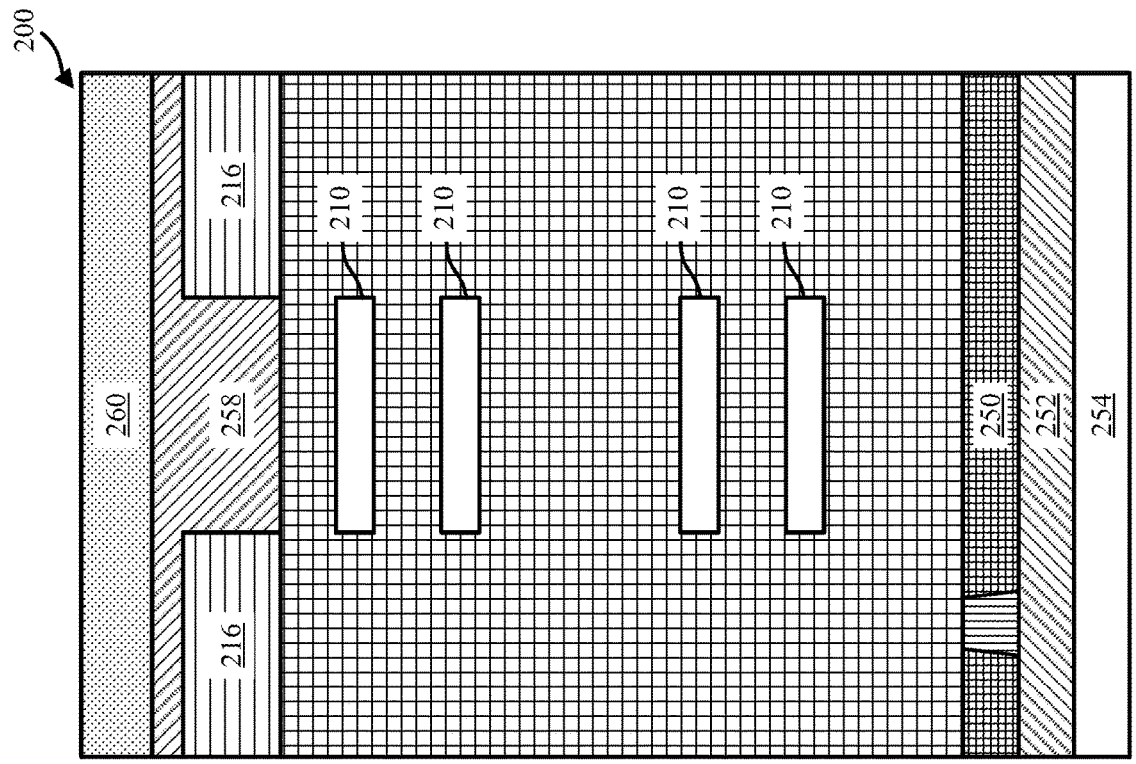
FIGS. 18A-18B illustrate cross-sectional views of the semiconductor device of FIGS. 17A-17B following the performance of additional fabrication operations, in accordance with embodiments of the present disclosure.
Figure 18B:
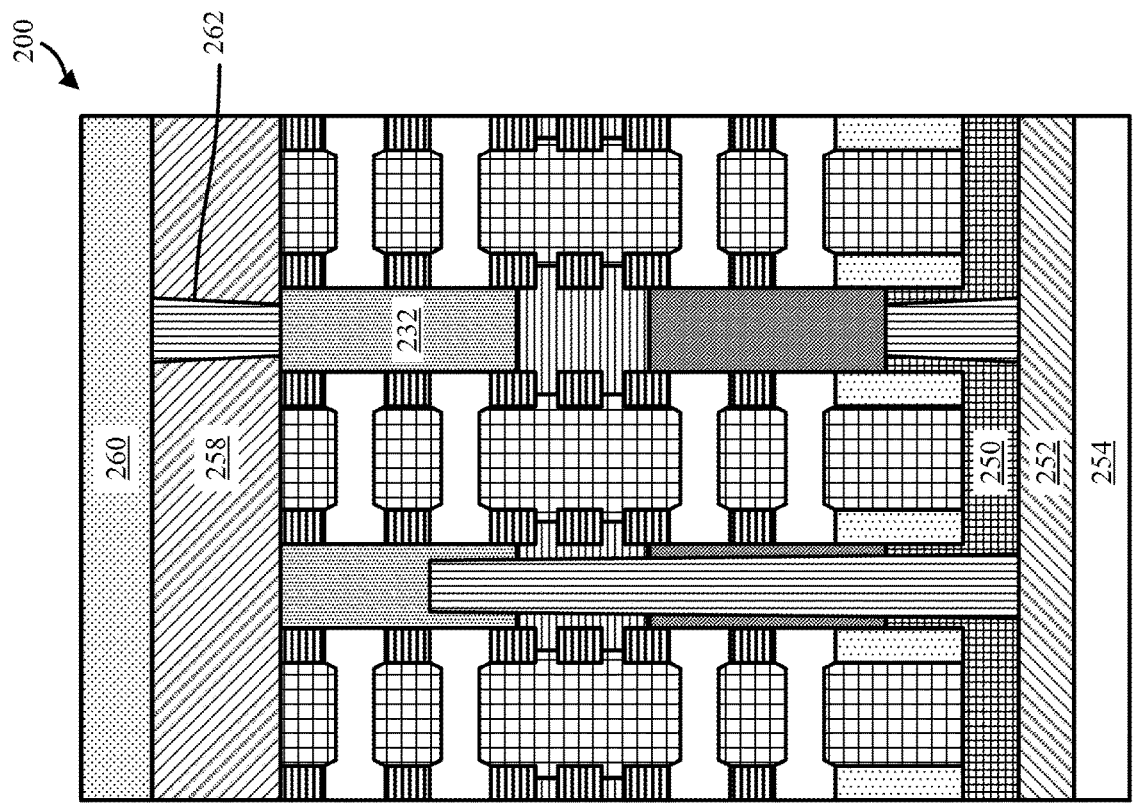

Next, a backside interconnect and contact are formed. This is shown in FIGS. 18A-18B. A backside ILD fill process and CMP process may be performed. As shown in FIGS. 18A-18B, the ILD 258 fill may be deposited on top of and around the STI 216, the gate 248, the bottom source/drain epitaxy 232, and the inner spacers 226. The CMP process may then planarize the top of the semiconductor device 200.

Backside contact patterning may then be performed. In particular, trenches may be patterned into the through the ILD 258 and into the bottom epitaxy 232 in areas where backside contacts are to be formed. This process allows for much better tolerance in the critical dimensions (CD) and overlay when compared to traditional processes.

Next, following a precontact clean, backside contacts 262 are formed in the trenches. The backside contacts 262 may be formed of any suitable conductive material such as, a silicide liner at bottom of the contact such as Ti, Ni, NiTi, NiPt, and conductive metal such as Ru or W, or Co, with a thin adhesion metal liner such as TiN. A backside interconnect 260 may then be formed on the ILD 258. The backside interconnect 260 may be formed at least partially on top of the backside contact 262, as shown in FIGS. 18A-18B.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A stacked field-effect transistor (FET) comprising:
   a top device;
   a bottom device; and
   a transition region between the top device and the bottom device, the transition region comprising a plurality of inner spacers separated by a first distance and a first inter-layer dielectric (ILD) formed between each of the plurality of inner spacers,
   wherein the top and bottom devices have a first channel sheet thickness in a gate region and a second channel sheet thickness between inner spacers, the second channel sheet thickness being larger than both the first channel sheet thickness and the first distance.

2. The stacked FET of claim 1, wherein the top and bottom devices are nanosheet transistors having the same doping type.

3. The stacked FET of claim 1, wherein the top and bottom devices are nanosheet transistors having different doping types.

4. The stacked FET of claim 1, wherein the top device comprises one or more top source/drain epitaxies and the bottom device comprises one or more bottom source/drain epitaxies.

5. The stacked FET of claim 4, further comprising:
   a second ILD formed on top of the top device;
   a back-end-of-line (BEOL) formed on top of the second ILD;
   a first contact connecting a first bottom source/drain epitaxy to the BEOL, wherein the first contact extends from the first bottom source/drain epitaxy through the first ILD, a first top source/drain epitaxy, and the second ILD.

6. The stacked FET of claim 5, further comprising:
   a second contact connecting a second top source/drain epitaxy to the BEOL, wherein the second contact extends from the second top source/drain epitaxy through the second ILD.

7. The stacked FET of claim 6, further comprising:
   a third ILD formed below the bottom device;
   a backside interconnect formed below the third ILD; and
   a third contact connecting a second bottom source/drain epitaxy to the backside interconnect, wherein the third contact extends from the second bottom source/drain epitaxy through the third ILD.

8. The stacked FET of claim 1, wherein:
   the second channel thickness is approximately 9 nm;
   the first channel thickness is approximately 6 nm; and
   the first distance is approximately 3 nm.

9. The stacked FET of claim 1, wherein the top device is an nFET device and the bottom device is a pFET device.

10. A method of fabricating a stacked FET, the method comprising:
    forming a nanosheet stack on top of a substrate, wherein the nanosheet stack comprises a plurality of semiconductor layers separated by sacrificial layers, wherein the nanosheet stack comprises a top region, a middle region, and a bottom region, the semiconductor layers in the top region having a first thickness, the semiconductor layers in the middle region having a second thickness, and the semiconductor layers in the bottom region having a third thickness, wherein the second thickness is smaller than both the first and third thicknesses;
    patterning the nanosheet stack to form a plurality of nanosheet fins;
    indenting the sacrificial layers in between the nanosheet fins;
    forming inner spacers in the indents in the sacrificial layers;
    forming one or more bottom source/drain epitaxies between the nanosheet fins in the bottom region;
    indenting the semiconductor layers in the middle region;

forming a bottom inter-layer dielectric (ILD) on the one or more bottom source/drain epitaxies, wherein the bottom ILD fills in the indents in the semiconductor layers;

forming one or more top source/drain epitaxies on top of the bottom ILD;

forming a top ILD on the one or more top source/drain epitaxies;

removing the sacrificial layers;

trimming the semiconductor layers such that the semiconductor layers in the middle region are removed and the semiconductor layers in the top and bottom regions are thinned; and forming a metal gate around the semiconductor layers.

11. The method of claim 10, wherein forming the nanosheet stack comprises:

forming a bottom nanosheet stack, wherein the bottom nanosheet stack comprises a first plurality of semiconductor layers separated by a sacrificial material, the first plurality of semiconductor layers having the first thickness;

forming a middle nanosheet stack on top of the bottom nanosheet stack, wherein the middle nanosheet stack comprises a second plurality of semiconductor layers separated by a sacrificial material, the second plurality of semiconductor layers having the second thickness;

forming a top nanosheet stack on top of the middle nanosheet stack, wherein the top nanosheet stack comprises a third plurality of semiconductor layers separated by a sacrificial material, the third plurality of semiconductor layers having the third thickness.

12. The method of claim 10, wherein forming the one or more bottom source/drain epitaxies comprises:

filling the region between the nanosheet fins with an organic planarization layer (OPL);

recessing the OPL such that a top of the OPL is between the top semiconductor layer in the middle region and the bottom semiconductor layer in the top region;

forming a protective spacer along sidewalls of the semiconductor layers and the inner spacers in the top region, wherein the protective spacer is deposited along the sidewalls selective to the OPL;

removing the OPL; and growing the bottom source/drain epitaxy to replace the OPL.

13. The method of claim 12, wherein forming the one or more bottom source/drain epitaxies further comprises:

recessing the bottom source/drain epitaxy such that the top of the bottom source/drain epitaxy is between the top semiconductor layer in the bottom region and the bottom semiconductor layer in the middle region.

14. The method of claim 13, wherein forming the one or more top source/drain epitaxies on top of the bottom ILD comprises:

removing the protective spacer; and growing the top source/drain epitaxy on top of the bottom ILD.

15. The method of claim 10, further comprising:

forming a third ILD on top of the top ILD;

forming a first contact, the first contact extending from a first top source/drain epitaxy to a top of the third ILD;

forming a second contact, the first second extending from a first bottom source/drain epitaxy to the top of the third ILD; and forming a back-end-of-line (BEOL) on top of the third ILD, the first contact, and the second contact.

16. The method of claim 15, wherein forming the first contact comprises:

forming a first trench in the third ILD and the top ILD, the first trench extending from the top of the third ILD to the top source/drain epitaxy, thereby exposing a portion of the top source/drain epitaxy; and filling the first trench with a conductive material.

17. The method of claim 15, wherein forming the second contact comprises:

forming a second trench, the second trench extending from the bottom source/drain epitaxy through the bottom ILD, through a second top source/drain epitaxy, through the top ILD, and through the third ILD, thereby exposing a portion of the bottom source/drain epitaxy; and filling the second trench with a conductive material.

18. A method comprising:

forming a top device comprising a first plurality of channel sheets separated by inner spacers and a metal gate;

forming a transition region comprising a plurality of inner spacers separated by a first distance and a first inter-layer dielectric (ILD) formed between each of the plurality of inner spacers; and forming a bottom device comprising a second plurality of channel sheet separated by inner spacers and the metal gate, wherein the top and bottom devices have a first channel sheet thickness in a gate region and a second channel sheet thickness between the inner spacers, the second channel sheet thickness being larger than both the first channel sheet thickness and the first distance.

19. The method of claim 18, wherein the top and bottom devices are nanosheet transistors.

20. The method of claim 18, wherein:

the second channel thickness is approximately 9 nm;

the first channel thickness is approximately 6 nm; and the first distance is approximately 3 nm.

* * * * *